United States Patent
Kuroda et al.

(10) Patent No.: US 9,757,888 B2
(45) Date of Patent: Sep. 12, 2017

(54) METHOD FOR MANUFACTURING ENCAPSULATING MATERIAL SHEET FOR SOLAR BATTERY

(71) Applicant: MITSUI CHEMICALS TOHCELLO, INC., Chiyoda-ku (JP)

(72) Inventors: Hiroyuki Kuroda, Mobara (JP); Takatoshi Yaoita, Chiba (JP); Shigeyuki Shishido, Kamakura (JP); Yukihiro Iwasaki, Mobara (JP); Takafumi Mori, Yokohama (JP); Katsuhiko Funaki, Chiba (JP); Hirofumi Zenkoh, Chiba (JP)

(73) Assignee: MITSUI CHEMICALS TOHCELLO, INC., Tokyo (JP)

( * ) Notice: Subject to any disclaimer, the term of this patent is extended or adjusted under 35 U.S.C. 154(b) by 390 days.

(21) Appl. No.: 14/397,027

(22) PCT Filed: Apr. 23, 2013

(86) PCT No.: PCT/JP2013/002724
§ 371 (c)(1),
(2) Date: Oct. 24, 2014

(87) PCT Pub. No.: WO2013/161273
PCT Pub. Date: Oct. 31, 2013

(65) Prior Publication Data
US 2015/0084230 A1    Mar. 26, 2015

(30) Foreign Application Priority Data

Apr. 27, 2012  (JP) .................................. 2012-103386
Jul. 31, 2012  (JP) .................................. 2012-169595

(51) Int. Cl.
*B29C 47/00*     (2006.01)
*B29C 47/10*     (2006.01)
(Continued)

(52) U.S. Cl.
CPC ............ *B29C 47/0021* (2013.01); *B29B 9/04* (2013.01); *B29B 9/16* (2013.01); *B29C 47/1081* (2013.01);
(Continued)

(58) Field of Classification Search
CPC ..... B29C 47/0021; B29C 47/38; B29C 47/40; B29C 47/92; B29C 2947/926;
(Continued)

(56) References Cited

U.S. PATENT DOCUMENTS 3,593,966 A * 7/1971 Munroe .................. B28C 7/026
366/40
4,117,195 A * 9/1978 Swarbrick ........... B29C 47/0004
174/110 S
(Continued)

FOREIGN PATENT DOCUMENTS

JP     5-220825 A     8/1993
JP     2006-210906 A  8/2006
(Continued)

OTHER PUBLICATIONS

International Search Report (PCT/ISA/210) mailed on Aug. 6, 2013, by the Japanese Patent Office as the International Searching Authority for International Application No. PCT/JP2013/002724.
(Continued)

*Primary Examiner* — Jeffrey Wollschlager
(74) *Attorney, Agent, or Firm* — Buchanan, Ingersoll & Rooney PC

(57) ABSTRACT

A method for manufacturing an encapsulating material sheet for a solar battery of the invention includes a step of producing an additive-containing pellet by soaking an additive A into a pellet including a polyolefin-based resin as a main component, a step of injecting the additive-containing pellet into a cylinder from a supply opening in an extrusion
(Continued)

molder, and melting and kneading a resin composition including the polyolefin-based resin and the additive A in the cylinder, and a step of molding by extrusion the resin composition from a die in the extrusion molder into a sheet shape.

13 Claims, 2 Drawing Sheets

(51) Int. Cl.

| | | |
|---|---|---|
| H01L 31/18 | (2006.01) | |
| B29B 9/04 | (2006.01) | |
| B29C 47/38 | (2006.01) | |
| C08J 3/20 | (2006.01) | |
| C08J 5/18 | (2006.01) | |
| B29D 7/01 | (2006.01) | |
| B29B 9/16 | (2006.01) | |
| B29K 105/24 | (2006.01) | |
| H01L 31/048 | (2014.01) | |
| B29B 7/38 | (2006.01) | |
| B29B 7/88 | (2006.01) | |
| B29C 47/14 | (2006.01) | |
| B29C 47/40 | (2006.01) | |
| B29C 47/82 | (2006.01) | |
| B29C 47/92 | (2006.01) | |
| B29K 23/00 | (2006.01) | |

(52) U.S. Cl.
CPC ................ *B29C 47/38* (2013.01); *B29D 7/01* (2013.01); *C08J 3/203* (2013.01); *C08J 5/18* (2013.01); *H01L 31/18* (2013.01); *B29B 7/38* (2013.01); *B29B 7/88* (2013.01); *B29B 2009/161* (2013.01); *B29C 47/1009* (2013.01); *B29C 47/14* (2013.01); *B29C 47/40* (2013.01); *B29C 47/822* (2013.01); *B29C 47/92* (2013.01); *B29C 2947/926* (2013.01); *B29C 2947/92828* (2013.01); *B29K 2023/00* (2013.01); *B29K 2105/24* (2013.01); *C08J 2323/08* (2013.01); *H01L 31/048* (2013.01); *H01L 31/0481* (2013.01); *Y02E 10/50* (2013.01)

(58) Field of Classification Search
CPC .......... B29C 2947/92828; B29C 47/14; B29C 47/1009; B29C 47/822; B29C 47/1081; B29D 7/01; C08J 5/18; C08J 3/203; C08J 2323/08; B29B 9/04; B29B 7/38; B29B 7/88; B29B 9/16; B29B 2009/161; B29K 2023/00; H01L 31/048; H01L 31/0481; H01L 31/049; H01L 31/18; B32B 2457/12; Y02E 10/50; Y02E 10/52
See application file for complete search history.

(56) References Cited

U.S. PATENT DOCUMENTS

| | | | | |
|---|---|---|---|---|
| 5,749,649 | A * | 5/1998 | Schobert-Csongor | .... B29B 7/12 366/76.4 |
| 2006/0058427 | A1* | 3/2006 | O'Neill | ..................... B01F 3/18 523/319 |
| 2010/0159213 | A1* | 6/2010 | Przybylinski | ........... B32B 27/04 428/195.1 |
| 2011/0061735 | A1* | 3/2011 | Nishijima | .............. C08F 210/02 136/259 |
| 2012/0024376 | A1 | 2/2012 | Fukudome et al. | |
| 2012/0168982 | A1 | 7/2012 | Cho et al. | |
| 2013/0167911 | A1* | 7/2013 | Ikenaga | .............. H01L 31/0481 136/251 |

FOREIGN PATENT DOCUMENTS

| | | |
|---|---|---|
| JP | 2009-256474 A | 11/2009 |
| JP | 2010-053298 A | 3/2010 |
| JP | 2010-155915 A | 7/2010 |
| JP | 2010-258439 A | 11/2010 |
| JP | 2012-079996 A | 4/2012 |
| WO | WO 2011/016557 A1 | 2/2011 |
| WO | WO 2012/020910 A2 | 2/2012 |
| WO | WO 2012/046456 A1 | 4/2012 |

OTHER PUBLICATIONS

Office Action issued by the Japanese Patent Office in corresponding Japanese Patent Application No. 2014-512354 on Aug. 11, 2015 (2 pages).

Extended Search Report issued by the European Patent Office in corresponding European Patent Application No. 13781753.2 on Jan. 14, 2016 (7 pages).

\* cited by examiner

METHOD FOR MANUFACTURING ENCAPSULATING MATERIAL SHEET FOR SOLAR BATTERY

TECHNICAL FIELD

The present invention relates to a method for manufacturing an encapsulating material sheet for a solar battery.

BACKGROUND ART

In response to the increasing seriousness of global environmental issues, energy issues, and the like, a solar battery is attracting attention as clean energy-generating means with no concern over depletion. In a case in which a solar battery is used outdoors such as on the roof of a building, it is usual to use the solar battery in a solar battery module form.

Generally, the solar battery module is manufactured in the following order. First, a crystalline solar battery element (hereinafter also referred to as a cell) formed of polycrystalline silicon or monocrystalline silicon, or a thin film-type solar battery element obtained by forming an extremely thin (several micrometers) film of amorphous silicon or crystal silicon on a glass substrate or the like is manufactured.

To obtain a crystalline solar battery module, first, a protective sheet (a transparent surface protective member) for the solar battery module, an encapsulating material sheet for a solar battery, the crystalline solar battery element, an encapsulating material sheet for a solar battery, and a protective sheet (a back surface protective member) for the solar battery module are sequentially laminated, thereby forming a laminate. Next, the obtained laminate is pressurized and heated, thereby being integrated. After that, the encapsulating material for a solar battery is cured through crosslinking, thereby manufacturing a solar battery module.

Meanwhile, to obtain a thin film-based solar battery module, a thin film-type solar battery element, an encapsulating material sheet for a solar battery, and a protective sheet (a back surface protective member) for the solar battery module are sequentially laminated, thereby forming a laminate. Next, the obtained laminate is pressurized and heated, thereby being integrated. After that, the encapsulating material for a solar battery is cured through crosslinking, thereby manufacturing a solar battery module.

The solar battery module manufactured in the above-described manner is weather resistant and is also suitable for outdoor use such as on the roof of a building.

An ethylene/vinyl acetate (EVA) copolymer film is widely used as an encapsulating material for a solar battery due to its excellent transparency, flexibility, adhesiveness, and the like. For example, Patent Document 1 (Japanese Unexamined Patent Publication No. 2010-53298) discloses an encapsulating film that is made of an EVA composition including a crosslinking agent and trimellitate, and is excellent in terms of both adhesiveness and film-forming properties.

In addition, there has been a proposal of using a polyolefin-based resin, particularly an ethylene-based resin, as an encapsulating material for a solar battery due to its excellent insulating properties (for example, refer to Patent Document 2).

In addition, there has been another proposal of a resin composition for an encapsulating material for a solar battery for which an ethylene/α-olefin copolymer being excellent in terms of the balance between stiffness and crosslinking characteristics, and extrusion moldability is used (for example, refer to Patent Document 3).

RELATED DOCUMENT

Patent Document

[Patent Document 1] Japanese Unexamined Patent Publication No. 2010-53298
[Patent Document 2] Japanese Unexamined Patent Publication No. 2006-210906
[Patent Document 3] Japanese Unexamined Patent Publication No. 2010-258439
[Patent Document 4] Japanese Unexamined Patent Publication No. 2009-256474

DISCLOSURE OF THE INVENTION

However, according to the present inventors' studies, it was found that, in the encapsulating material sheet for a solar battery including the polyolefin-based resin as a main component, there was a case in which an additive was segregated in the sheet. Therefore, for the encapsulating material sheet for a solar battery including the polyolefin-based resin as a main component, there is room for the improvement of yield.

Patent Document 4 (Japanese Unexamined Patent Publication No. 2009-256474) describes that, when the polyolefin-based resin and additives for the polyolefin-based resin are included at a predetermined ratio, and a master batch pellet having a grain size that is less than or equal to a specific value is used, it is possible to obtain a polyolefin-based film in which the additives used to supply a variety of functions are not segregated, and the additives are homogeneously dispersed in the matrix resin.

However, the master batch pellet is manufactured by melting and kneading the polyolefin-based resin and the additives in advance using an extrusion molder as described above. Therefore, when the encapsulating agent sheet for a solar battery is manufactured, the additives are melted and kneaded twice in the extrusion molder, and therefore some of the additives are deteriorated due to the friction heat generated during heating or kneading. Particularly, the additives used for the encapsulating material sheet for a solar battery are easily deteriorated by heat, and the appearance of the obtained sheet is deteriorated, or the long-term reliability such as weather resistance and heat resistance degrades.

The invention has been made in consideration of the above-described circumstances, and provides a method for manufacturing an encapsulating material sheet for a solar battery in which an encapsulating material sheet for a solar battery having excellent qualities can be manufactured with a favorable yield.

As a result of intensive studies to achieve the above-described object, the inventors found that, the soaking rate of additives is slower in a non-polar polyolefin-based resin compared with a polar copolymer such as an ethylene/vinyl acetate copolymer, and therefore the polyolefin-based resin and the additives are insufficiently kneaded in an extrusion molder in some cases, and in such cases, the additives are segregated in the sheet.

Therefore, the inventors further repeated intensive studies. As a result, the inventors found that, when additives are soaked into a pellet including a polyolefin-based resin as a main component in advance so as to produce an additive-containing pellet, and the additive-containing pellet is used, an encapsulating material for a solar battery enabling the homogeneous dispersion of the additives in the sheet can be stably obtained, and completed the invention.

That is, according to the invention, there is provided a method for manufacturing an encapsulating material sheet for a solar battery described below.

[1] A method for manufacturing an encapsulating material sheet for a solar battery, including:

a step of producing an additive-containing pellet by soaking an additive A into a pellet including a polyolefin-based resin as a main component;

a step of injecting the additive-containing pellet into a cylinder from a supply opening in an extrusion molder, and melting and kneading a resin composition including the polyolefin-based resin and the additive A in the cylinder; and a step of molding by extrusion the resin composition from a die in the extrusion molder into a sheet shape.

[2] The method for manufacturing an encapsulating material sheet for a solar battery according to the above-described [1], in which the additive A is in a liquid form.

[3] The method for manufacturing an encapsulating material sheet for a solar battery according to the above-described [1] or [2], in which the additive A is prepared by dispersing or dissolving at least one solid additive in a liquid additive.

[4] The method for manufacturing an encapsulating material sheet for a solar battery according to the above-described [3], in which the liquid additive is at least one additive selected from a group consisting of an organic peroxide and a silane coupling agent.

[5] The method for manufacturing an encapsulating material sheet for a solar battery according to the above-described [3] or [4], in which the solid additive is at least one additive selected from a group consisting of an ultraviolet absorber, a heat-resistant stabilizer, and a light stabilizer.

[6] The method for manufacturing an encapsulating material sheet for a solar battery according to any one of the above-described [1] to [5], in which, in the melting and kneading step, an additive B that is identical to or different from the additive A is further added to the cylinder from an infusion nozzle provided between the supply opening and a front end of a screw.

[7] The method for manufacturing an encapsulating material sheet for a solar battery according to the above-described [6], in which the additive B is in a liquid form.

[8] The method for manufacturing an encapsulating material sheet for a solar battery according to the above-described [6] or [7], in which the additive B is prepared by dispersing or dissolving at least one solid additive in a liquid additive.

[9] The method for manufacturing an encapsulating material sheet for a solar battery according to any one of the above-described [6] to [8], in which the additive B includes a crosslinking aid.

[10] The method for manufacturing an encapsulating material sheet for a solar battery according to any one of the above-described [6] to [9], in which the additive B does not substantially include at least one additive selected from a group consisting of an organic peroxide and a silane coupling agent.

[11] The method for manufacturing an encapsulating material sheet for a solar battery according to any one of the above-described [6] to [10], in which, with respect to 100 parts by weight of the polyolefin-based resin, the additive A includes more than or equal to 0.1 parts by weight and less than or equal to 3 parts by weight of the organic peroxide and more than or equal to 0.1 parts by weight and less than or equal to 4 parts by weight of the silane coupling agent, and the additive B includes more than or equal to 0.05 parts by weight and less than or equal to 5 parts by weight of the crosslinking aid.

[12] The method for manufacturing an encapsulating material sheet for a solar battery according to any one of the above-described [1] to [11], in which, in the step of producing the additive-containing pellet, the pellet and the additive A are supplied to a stirring and mixing device, and are stirred and mixed, thereby soaking the additive A into the pellet.

[13] The method for manufacturing an encapsulating material sheet for a solar battery according to the above-described [12], in which a soaking state of the additive A into the pellet is confirmed using a motor power value of the stirring and mixing device.

[14] The method for manufacturing an encapsulating material sheet for a solar battery according to any one of the above-described [1] to [13], in which a weight change rate of the polyolefin-based resin is less than or equal to 3 weight % when immersed into a liquid-form crosslinking aid at 50° C. for three hours.

[15] The method for manufacturing an encapsulating material sheet for a solar battery according to the above-described [14], in which the liquid-form crosslinking aid is triallyl isocyanurate.

[16] The method for manufacturing an encapsulating material sheet for a solar battery according to any one of the above-described [1] to [15], in which the polyolefin-based resin is an ethylene/α-olefin copolymer.

[17] The method for manufacturing an encapsulating material sheet for a solar battery according to the above-described [16], in which the ethylene/α-olefin copolymer includes ethylene and an α-olefin having 3 to 20 carbon atoms, a content ratio of a structural unit derived from the ethylene that is included in the ethylene/α-olefin copolymer is in a range of 80 mol % to 90 mol %, and a content ratio of a structural unit derived from the α-olefin having 3 to 20 carbon atoms that is included in the ethylene/α-olefin copolymer is in a range of 10 mol % to 20 mol %.

Furthermore, according to the invention, there is provided a method for manufacturing an encapsulating material sheet for a solar battery described below.

[18] A method for manufacturing an encapsulating material sheet for a solar battery, including:

a step of producing a crosslinking agent-containing pellet by soaking a crosslinking agent into a resin pellet;

a step of injecting the crosslinking agent-containing pellet into a cylinder from a supply opening in an extrusion molder, and melting and kneading a resin composition including a resin in the resin pellet and the crosslinking agent in the cylinder;

a step of adding at least one additive of a crosslinking aid and a silane coupling agent to the cylinder from an infusion nozzle provided between the supply opening and a front end of a screw; and a step of molding by extrusion the resin composition from a die in the extrusion molder into a sheet shape.

According to the invention, it is possible to provide a method for manufacturing an encapsulating material sheet for a solar battery in which an encapsulating material sheet for a solar battery having excellent qualities can be manufactured with a favorable yield.

BRIEF DESCRIPTION OF THE DRAWINGS

The above-described object, other objects, characteristics, and advantages will be further clarified using preferable embodiments described below and the following drawings attached to the embodiments.

DESCRIPTION OF EMBODIMENTS

Figure 1:
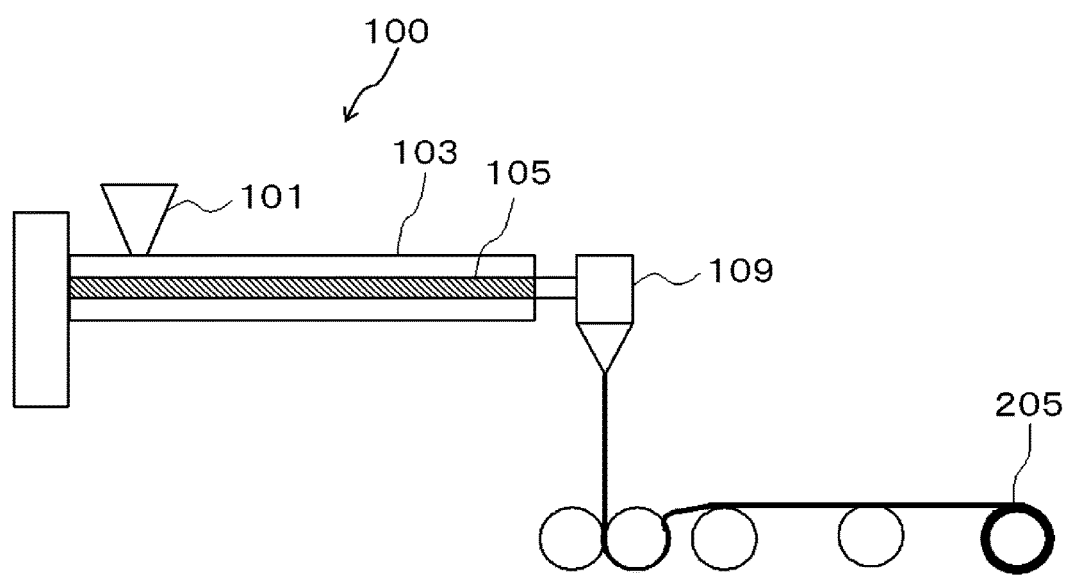
FIG. 1 is a schematic view of a manufacturing facility for carrying out a method for manufacturing an encapsulating material sheet for a solar battery of a first embodiment according to the invention.

Hereinafter, the embodiments of the invention will be described using the drawings. Further, in all the drawings, the same components will be given the same reference numerals and will not be repeated. The drawings are schematic views, and do not always coincide with the actual dimensional ratios. In addition, "A to B" indicates "more than or equal to A and less than or equal to B" unless particularly otherwise described.

(First Embodiment)

First, a method for manufacturing an encapsulating material sheet for a solar battery of a first embodiment according to the invention will be described.

FIG. 1 is a schematic view of a manufacturing facility for carrying out the method for manufacturing an encapsulating material sheet for a solar battery of the first embodiment according to the invention. The method for manufacturing an encapsulating material sheet for a solar battery of the embodiment includes a step of producing an additive-containing pellet by soaking an additive A into a pellet including a polyolefin-based resin as a main component, a step of injecting the additive-containing pellet into a cylinder 103 from a supply opening 101 in an extrusion molder 100, and melting and kneading a resin composition including the polyolefin-based resin and the additive A in the cylinder 103, and a step of molding by extrusion the resin composition from a die 109 in the extrusion molder 100 into a sheet shape.

(Individual Materials Used for Manufacturing an Encapsulating Material Sheet for a Solar Battery)

An encapsulating material sheet for a solar battery obtained using the manufacturing method of the embodiment includes a polyolefin-based resin and at least one additive as essential components. Hereinafter, individual materials used for manufacturing an encapsulating material sheet for a solar battery of the embodiment will be described in detail.

(Polyolefin-based Resin)

There is no particular limitation regarding the polyolefin-based resin in the embodiment, and examples thereof include low-density ethylene-based resins, intermediate-density ethylene resins, ultralow-density ethylene-based resins, propylene (co)polymers, 1-butene (co)polymers, 4-methylpentene-1 (co)polymers, ethylene/α-olefin copolymers, ethylene/cyclic olefin copolymers, ethylene/α-olefin/cyclic olefin copolymers, ethylene/α-olefin/unconjugated polyene copolymers, ethylene/α-olefin/conjugated polyene copolymers, ethylene/aromatic vinyl copolymers, ethylene/α-olefin/aromatic vinyl copolymers, and the like.

These polyolefin-based resins may be singly used or two or more polyolefin-based resins may be used in a mixed form.

Among the above-described polyolefin-based resins, the ethylene/α-olefin copolymers including ethylene and an α-olefin having 3 to 20 carbon atoms are preferred since the balance among a variety of characteristics required for the encapsulating material for a solar battery such as transparency, adhesiveness, flexibility, heat resistance, appearance, crosslinking characteristics, electrical characteristics, and extrusion moldability is excellent.

The melt flow rate (MFR) of the polyolefin-based resin in the embodiment, which is on the basis of ASTM D1238 and is measured under conditions of a temperature of 190° C. and a load of 2.16 kg, is preferably in a range of 10 g/10 minutes to 50 g/10 minutes, and more preferably in a range of 10 g/10 minutes to 27 g/10 minutes. The MFR of the polyolefin-based resin can be adjusted by adjusting the polymerization temperature and polymerization pressure in a polymerization reaction, the molar ratio between the monomer concentration and the hydrogen concentration in ethylene in a polymerization system, and the like.

When the MFR is more than or equal to 10 g/10 minutes, the fluidity of a resin composition including the polyolefin-based resin improves, and it is possible to improve the productivity during sheet extrusion molding. In addition, the scorch property of the resin composition degrades, and therefore it is possible to suppress gelatinization. When gelatinization is suppressed, the torque of an extruder decreases, and thus sheet molding can be facilitated. In addition, since it is possible to suppress the generation of a gel-form substance in the extruder after a sheet is obtained, it is possible to suppress the sheet surface becoming uneven and to suppress the degradation of the appearance.

When a gel-form substance is present in the sheet, the application of a voltage causes cracks in the periphery of the gel-form substance, and the dielectric breakdown voltage is decreased. But the decrease in the dielectric breakdown voltage can be suppressed by setting the MFR to more than or equal to 10 g/10 minutes. In addition, when a gel-form substance is present in the sheet, the interface with the gel-form substance becomes moisture-permeable, but it is also possible to suppress the degradation of moisture permeability by setting the MFR to more than or equal to 10 g/10 minutes.

In addition, when the sheet surface becomes uneven, the tight adhesion between a transparent surface protective member, a cell, an electrode, and a back surface protective member deteriorates, and the adhesion becomes insufficient during the lamination process of a solar battery module; however, when the MFR is set to less than or equal to 50 g/10 minutes, the molecular weight becomes great, and the attachment of the sheet to surface of a roll such as a chilled roll can be suppressed, and therefore peeling is not required, and it is possible to mold a sheet in a uniform thickness. Furthermore, since the resin composition becomes "stiff", it is possible to easily mold a sheet having a thickness of more than or equal to 0.1 mm. In addition, since the crosslinking characteristic is improved during the lamination molding of the solar battery module, the sheet is sufficiently crosslinked so that the degradation of the heat resistance can be suppressed. When the MFR is less than or equal to 27 g/10 minutes, furthermore, it is possible to suppress drawdown during sheet molding, to mold a sheet having a wide width, to further improve the crosslinking characteristic and the heat resistance, and to obtain the most favorable encapsulating material sheet for a solar battery.

The density of the polyolefin-based resin in the embodiment, which is measured on the basis of ASTM D1505, is preferably in a range of 0.865 g/cm$^3$ to 0.884 g/cm$^3$. The density of the polyolefin-based resin can be adjusted using the content ratio of an ethylene unit. That is, when the content ratio of the ethylene unit is increased, the crystallinity increases, and the polyolefin-based resin having a high density can be obtained. On the other hand, when the content ratio of the ethylene unit is decreased, the crystallinity decreases, and the polyolefin-based resin having a low density can be obtained.

When the density of the polyolefin-based resin is less than or equal to 0.884 g/cm$^3$, the crystallinity becomes low, and it is possible to increase the transparency. Furthermore, extrusion-molding at a low temperature becomes easy, for example, extrusion-molding at less than or equal to 130° C. becomes possible. Therefore, even when an organic peroxide is forcibly inserted into the polyolefin-based resin, it is possible to prevent the progress of a crosslinking reaction in an extruder. In addition, since the flexibility is high, it is possible to prevent the occurrence of cracking in a cell which is a solar battery element or the chipping of a thin film electrode during the lamination molding of the solar battery module.

On the other hand, when the density of the polyolefin-based resin is more than or equal to 0.865 g/cm$^3$, it is possible to increase the crystallization rate of the polyolefin-based resin, and therefore a sheet extruded from an extruder does not become easily sticky, the sheet becomes easily peeled from a first cooling roll, and it is possible to easily obtain an encapsulating material sheet for a solar battery. In addition, since the sheet does not become easily sticky, it is possible to suppress the occurrence of blocking and to improve the feeding property of the sheet. In addition, since the sheet is sufficiently crosslinked, it is possible to suppress the degradation of the heat resistance.

In addition, the shore A hardness of the polyolefin-based resin in the embodiment, which is measured on the basis of ASTM D2240, is preferably in a range of 60 to 85, more preferably in a range of 62 to 83, still more preferably in a range of 62 to 80, and particularly preferably in a range of 65 to 80. The shore A hardness of the polyolefin-based resin can be adjusted by controlling the content ratio or density of an ethylene unit in the polyolefin-based resin within the above-described numeric range. That is, the shore A hardness becomes great in the polyolefin-based resin having a high content ratio and a high density of the ethylene unit. On the other hand, the shore A hardness becomes low in the polyolefin-based resin having a low content ratio and a low density of the ethylene unit. The shore A hardness is measured after more than or equal to 15 seconds elapses from the application of a load to a specimen sheet.

When the shore A hardness is more than or equal to 60, the polyolefin-based resin does not become easily sticky, and is capable of suppressing blocking. In addition, when the encapsulating material for a solar battery is processed into a sheet shape, it is also possible to improve the feeding property of the sheet, and to suppress the degradation of the heat resistance.

On the other hand, when the shore A hardness is less than or equal to 85, the crystallinity becomes low, and it is possible to increase the transparency. Furthermore, since the flexibility is high, it is possible to prevent the occurrence of cracking in a cell which is the solar battery element or the chipping of the thin film electrode during the lamination molding of the solar battery module.

(Ethylene/α-olefin Copolymer)

The ethylene/α-olefin copolymer including ethylene and an α-olefin having 3 to 20 carbon atoms in the embodiment can be obtained by, for example, copolymerizing ethylene and an α-olefin having 3 to 20 carbon atoms. As the α-olefin, generally, it is possible to singly use an α-olefin having 3 to 20 carbon atoms, or to use a combination of two or more α-olefins having 3 to 20 carbon atoms.

Among the above-described α-olefins, an α-olefin having 10 or less carbon atoms is preferred, and an α-olefin having 3 to 8 carbon atoms is particularly preferred.

Specific examples of the α-olefin include propylene, 1-butene, 1-pentene, 1-hexene, 3-methyl-1-butene, 3,3-dimethyl-1-butene, 4-methyl-1-pentene, 1-octene, 1-decene, 1-dodecene, and the like. Among the above-described α-olefins, propylene, 1-butene, 1-pentene, 1-hexene, 4-methyl-1-pentene, and 1-octene are preferred in terms of easy procurement. The ethylene/α-olefin copolymer may be a random copolymer or a block copolymer, but is preferably a random copolymer from the viewpoint of flexibility.

The content ratio of a structural unit which is included in the ethylene/α-olefin copolymer of the embodiment and is derived from the α-olefin having 3 to 20 carbon atoms (hereinafter, also referred to as "α-olefin unit"), is preferably in a range of 10 mol % to 20 mol %.

When the content ratio of the α-olefin unit is more than or equal to 10 mol %, a sheet having high transparency can be obtained. In addition, it is possible to easily carry out extrusion-molding at a low temperature, for example, extrusion-molding at a temperature of less than or equal to 130° C. is possible.

Therefore, even in a case in which the organic peroxide is forcibly inserted into the ethylene/α-olefin copolymer, it is possible to suppress the progress of a crosslinking reaction in an extruder. In addition, since appropriate flexibility can be obtained, it is possible to prevent the occurrence of cracking in the solar battery element or the chipping of the thin film electrode during the lamination molding of the solar battery module.

When the content ratio of the α-olefin unit is less than or equal to 20 mol %, the crystallization rate of the ethylene/α-olefin copolymer becomes appropriate, and therefore a sheet extruded from an extruder does not become sticky, the sheet is easily peeled from the first cooling roll, and it is possible to efficiently obtain a sheet-shaped sheet of the encapsulating material for a solar battery.

In addition, since the sheet does not become sticky, blocking can be prevented, and the feeding property of the sheet is favorable. In addition, it is also possible to prevent the degradation of the heat resistance.

The ethylene/α-olefin copolymer of the embodiment particularly preferably satisfies the following requirements a1 to a4:

a1) a content ratio of a structural unit derived from ethylene is in a range of 80 mol % to 90 mol %, and the content ratio of the structural unit derived from an α-olefin having 3 to 20 carbon atoms is in a range of 10 mol % to 20 mol %;

a2) the MFR, which is on the basis of ASTM D1238 and is measured under conditions of a temperature of 190° C. and a load of 2.16 kg, is in a range of 10 g/10 minutes to 50 g/10 minutes;

a3) the density, which is measured on the basis of ASTM D1505, is in a range of 0.865 g/cm$^3$ to 0.884 g/cm$^3$; and a4) the shore A hardness, which is measured on the basis of ASTM D2240, is in a range of 60 to 85.

(Additives)

There is no particular limitation regarding the additives in the embodiment, and additives generally used for an encapsulating material sheet for a solar battery can be appropriately selected and used. Examples of the additives generally used for an encapsulating material sheet for a solar battery include an organic peroxide, a silane coupling agent, a crosslinking aid, an ultraviolet absorber, a heat-resistant stabilizer, a light stabilizer, and the like.

(Organic Peroxide)

The organic peroxide in the embodiment is used as a radical initiator during the graft modification of the silane coupling agent and the polyolefin-based resin, and furthermore, is used as a radial initiator during a crosslinking reaction when the polyolefin-based resin is molded by lamination to the solar battery module. When the silane coupling agent is graft-modified in the polyolefin-based resin, a solar battery module having a favorable adhesiveness between the transparent surface protective member, the back surface protective member, the cell, and the electrode is obtained. Furthermore, when the polyolefin-based resin is crosslinked, a solar battery module having excellent heat resistance and adhesiveness can be obtained.

In the embodiment, the organic peroxide is required to be capable of graft-modifying the silane coupling agent in the polyolefin-based resin or crosslinking the polyolefin-based resin. A one-minute half-life temperature of the organic peroxide is preferably in a range of 100° C. to 170° C. in consideration of the balance between the productivity in extrusion sheet molding and the crosslinking rate during the lamination molding of the solar battery module.

When the one-minute half-life temperature of the organic peroxide is more than or equal to 100° C., it is possible to suppress the progress of a crosslinking reaction of the encapsulating material for a solar battery during extrusion sheet molding. When the one-minute half-life temperature of the organic peroxide is less than or equal to 170° C., it is possible to suppress a decrease in the crosslinking rate during the lamination molding of the solar battery module, and therefore it is possible to prevent the degradation of the productivity of the solar battery module. In addition, it is also possible to prevent the degradation of the heat resistance and adhesiveness of the encapsulating material for a solar battery.

A well-known organic peroxide can be used as the organic peroxide. Specific examples of the preferable organic peroxide having a one-minute half-life temperature in a range of 100° C. to 170° C. include dilauroyl peroxide, 1,1,3,3-tetramethylbutyl peroxy-2-ethylhexanoate, dibenzoyl peroxide, t-amylperoxy-2-ethylhexanoate, t-butylperoxy-2-ethylhexanotae, t-butylperoxy isobutyrate, t-butylperoxy maleate, 1,1-di(t-amylperoxy)-3,3,5-trimethylcyclohexane, 1,1-di(t-amylperoxy)cyclohexane, t-amylperoxy isononanoate, t-amylperoxy normaloctoate, 1,1-di(t-butylperoxy)-3,3,5-trimethylcyclohexane, 1,1-di(t-butylperoxy)cyclohexane, t-butylperoxy isopropyl carbonate, t-butylperoxy-2-ethyl-hexylcarbonate, 2,5-dimethyl-2,5-di(benzolyperoxy) hexane, t-amyl-peroxybenzoate, t-butylperoxy acetate, t-butylperoxy isononanoate, 2,2-di(t-butylperoxy)butane, t-butylperoxy benzoate, 2,5-dimethyl-2,5-di(t-butylperoxy) hexane, t-butyl-peroxybenzoate, and the like. Preferable examples thereof include dilauroyl peroxide, t-butylperoxy isopropyl carbonate, t-butyl peroxy acetate, t-butylperoxy isononanoate, t-butylperoxy-2-ethylhexyl carbonate, t-butylperoxy benzoate, 1,1-di(t-butylperoxy)cyclohexane, 2,2-di(t-butylperoxy)butane, 2,5-dimethyl-2,5-di(t-butylperoxy) hexane, and the like. Particularly preferable examples thereof include 2,5-dimethyl-2,5-di(t-butyl peroxy)hexane, t-butylperoxy-2-ethylhexyl carbonate, 1,1-di(t-butyl peroxy)cyclohexane, t-butyl-peroxybenzoate, and the like. A liquid-form organic peroxide is preferred since the liquid organic peroxide is rapidly soaked, and furthermore, is capable of being added after dispersing or dissolving the solid-form additive. The organic peroxide may be singly used or two or more organic peroxides may be used in a mixed form.

The amount of the organic peroxide added varies depending on the type of the organic peroxide, but is preferably in a range of 0.1 parts by weight to 3 parts by weight, and more preferably in a range of 0.2 parts by weight to 3 parts by weight with respect to 100 parts by weight of the polyolefin-based resin.

(Silane Coupling Agent)

The silane coupling agent in the embodiment is useful for improving the adhesiveness to a protective member, the solar battery element, and the like. Examples of the silane coupling agent include compounds having a hydrolysable group such as an alkoxy group together with an amino group or an epoxy group. Specific examples thereof include vinyltriethoxysilane, vinyl trimethoxysilane, vinyl tris(β-methoxyethoxy) silane, γ-glycidoxypropyl trimethoxysilane, γ-aminopropyl triethoxysilane, and γ-methacryloxypropyl trimethoxysilane. Preferable examples thereof include γ-glycidoxypropyl methoxysilane, γ-aminopropyl triethoxysilane, γ-methacryloxypropyl trimethoxysilane, and vinyltriethoxysilane, all of which have favorable adhesiveness. The above-described silane coupling agents may be singly used or two or more silane coupling agents may be used in a mixed form.

The amount of the silane coupling agent added varies depending on the type of the silane coupling agent, but is preferably in a range of 0.1 parts by weight to 4 parts by weight, and more preferably in a range of 0.1 parts by weight to 3 parts by weight with respect to 100 parts by weight of the polyolefin-based resin. When the amount of the silane coupling agent added is more than or equal to the above-described lower limit value, the adhesiveness of the encapsulating material sheet for a solar battery is excellent. In addition, when the amount of the silane coupling agent added is less than or equal to the above-described upper limit value, the balance between the cost and performance of the encapsulating material sheet for a solar battery is excellent.

(Crosslinking Aid)

The crosslinking aid in the embodiment is effective for accelerating the crosslinking reaction, and increasing the crosslinking degree of the polyolefin-based resin. Examples of the crosslinking aid include well-known crosslinking aids of the related art that are ordinarily used for olefin-based resins. The crosslinking aid is a compound having one or more double bonds in the molecule, and is preferably a compound having two or more double bonds.

Specific examples thereof include monoacrylates such as t-butyl acrylate, lauryl acrylate, cetyl acrylate, stearyl acrylate, 2-methoxyethyl acrylate, ethylcarbitol acrylate, and methoxytripropylene glycol acrylate; monomethacrylates such as t-butyl methacrylate, lauryl methacrylate, cetyl methacrylate, stearyl methacrylate, methoxyethylene glycol methacrylate, and methoxypolyethylene glycol methacrylate; diacrylates such as 1,4-butanediol diacrylate, 1,6-hexanediol diacrylate, 1,9-nonanediol diacrylate, neopentyl glycol diacrylate, diethylene glycol diacrylate, tetraethylene glycol diacrylate, polyethylene glycol diacrylate, tripropylene glycol diacrylate, and polypropylene glycol diacrylate; dimethacrylates such as 1,3-butanediol dimethacrylate, 1,6-hexanediol dimethacrylate, 1,9-nonanediol dimethacrylate, neopentyl glycol dimethacrylate, ethylene glycol dimethacrylate, diethylene glycol dimethacrylate, triethylene glycol dimethacrylate, and polyethylene glycol dimethacrylate; triacrylates such as trimethylol propane triacrylate, tetramethylol methane triacrylate, and pentaerythritol triacrylate; trimethacrylates such as trimethylol propane trimethacrylate and trimethylol ethane trimethacrylate; tetraacrylates such as pentaerythritol tetraacrylate, tetramethylol methane tetraacrylate, and dimethylol propane tetraacrylate; divinyl aromatic compounds such as divinyl benzene and di-i-propenyl benzene; cyanurates such as triallyl cyanurate and triallyl isocyanurate; diallyl compounds such as diallyl phthalate; and triallyl compounds; oximes such as p-quinone dioxime and p-p'-dibenzoyl quinone dioxime; and maleimides such as phenyl maleimide.

Among the above-described crosslinking aids, diacrylate; dimethacrylate; divinyl aromatic compounds; triacrylates such as trimethylol propane triacrylate, tetramethylol methane triacrylate, and pentaerythritol triacrylate; trimethacrylates such as trimethylol propane trimethacrylate and trimethylol ethane trimethacrylate; tetraacrylates such as pentaerythritol tetraacrylate, tetramethylol methane tetraacrylate, and dimethylol propane tetraacrylate; cyanurates such as triallyl cyanurate and triallyl isocyanurate; diallyl compounds such as diallyl phthalate; triallyl compounds; oximes such as p-quinone dioxime and p-p'-dibenzoyl quinonedioxime; maleimides such as phenyl maleimide are more preferred. Furthermore, among the above-described crosslinking aids, triallyl isocyanurate, pentaerythritol triacrylate, trimethylol propane triacrylate, trimethylol propane trimethacrylate, and dimethylol propane tetraacrylate are particularly preferred since the balance of the generation of air bubbles or crosslinking characteristics in the encapsulating material for a solar battery after lamination is most favorable. The crosslinking aid is preferably in a liquid form, and from such a viewpoint, the crosslinking aid is preferably triallyl isocyanurate and/or a liquid-form (meth)acrylate compound. The above-described crosslinking aids may be singly used or two or more crosslinking aids may be used in a mixed form.

The amount of the crosslinking aid added varies depending on the type of the crosslinking aid, but is preferably in a range of 0.05 parts by weight to 5 parts by weight with respect to 100 parts by weight of the polyolefin-based resin. When the amount of the crosslinking aid added is within the above-described range, it is possible to have an appropriate crosslinking structure and to improve heat resistance, mechanical properties, and adhesiveness.

(Ultraviolet Absorber)

Specific examples of the ultraviolet absorber in the embodiment include benzophenone-based ultraviolet absorbers such as 2-hydroxy-4-normal-octyloxylbenzophenone, 2-hydroxy-4-methoxybenzophenone, 2,2-dihydroxy-4-methoxybenzophenone, 2-hydroxy-4-methoxy-4-carboxybenzophenone, and 2-hydroxy-4-N-octoxybenzophenone; benzotriazole-based ultraviolet absorbers such as 2-(2-hydroxy-3,5-di-t-butylphenyl)benzotriazole and 2-(2-hydroxy-5-methylphenyl)benzotriazole; and salicylic acid ester-based ultraviolet absorbers such as phenyl salicylate and p-octyl phenyl salicylate. The above-described ultraviolet absorbers may be singly used or two or more crosslinking aids may be used in a mixed form.

The amount of the ultraviolet absorber added varies depending on the type of the ultraviolet absorber, but is preferably in a range of 0.005 parts by weight to 5 parts by weight with respect to 100 parts by weight of the polyolefin-based resin. When the amount of the ultraviolet absorber added is within the above-described range, it is possible to sufficiently ensure an effect that improves the weather-resistant stability, and to prevent the degradation of the transparency or adhesiveness to the transparent surface protective member, the back surface protective member, the cell, the electrode, and aluminum of the encapsulating material for a solar battery, which is preferable.

(Light Stabilizer)

As the light stabilizer in the embodiment, a hindered amine-based light stabilizer such as bis(2,2,6,6-tetramethyl-4-piperidyl)sebacate, poly[{6-(1,1,3,3-tetramethylbutyl) amino-1,3,5-triazine-2,4-diyl}{(2,2,6,6-tetramethyl-4-piperidyl)imino}hexamethylene{(2,2,6,6-t etramethyl-4-piperidyl)imino}]; hindered piperidine-based compounds; or the like is preferably used. The above-described light stabilizers may be singly used or two or more light stabilizers may be used.

The amount of the light stabilizer added varies depending on the type of the light stabilizer, but is preferably in a range of 0.005 parts by weight to 5 parts by weight with respect to 100 parts by weight of the polyolefin-based resin. When the amount of the light stabilizer added is within the above-described range, it is possible to sufficiently ensure an effect that improves the weather-resistant stability, and to prevent the degradation of the transparency or adhesiveness to the transparent surface protective member, the back surface protective member, the cell, the electrode, and aluminum of the encapsulating material for a solar battery, which is preferable.

(Heat-resistant Stabilizer)

Specific examples of the heat-resistant stabilizer in the embodiment include phosphite-based heat-resistant stabilizer such as tris(2,4-di-tert-butylphenyl)phosphite, bis[2,4-bis(1,1-dimethylethyl)-6-methylphenyl]ethylester phosphorous acid, tetrakis(2,4-di-tert-butylphenyl) [1,1-biphenyl]-4,4'-diylbisphosphonite, and bis(2,4-di-tert-butylphenyl) pentaerythritol diphosphite; lactone-based heat-resistant stabilizers such as a reaction product of 3-hydroxy-5,7-di-tert-butyl-furan-2-one and o-xylene; hindered phenol-based heat-resistant stabilizers such as 3,3',3",5,5',5"-hexa-tert-butyl-a,a',a"-(methylene-2,4,6-triyl)tri-p-cresol, 1,3,5-trimethyl-2,4,6-tris(3,5-di-tert-butyl-4-hydroxyphenyl)benzylbenzene, pentaerythritol tetrakis[3-(3,5-di-tert-butyl-4-hydroxyphenyl)propionate], octadecyl-3-(3,5-di-tert-butyl-4-hydroxyphenyl)propionate, and thiodiethylene bis[3-(3,5-di-tert-butyl-4-hydroxyphenyl)propionate]; sulfur-based heat-resistant stabilizers; amine-based heat-resistant stabilizers; and the like. Among the above-described heat-resistant stabilizers, the phosphite-based heat-resistant stabilizers and the hindered phenol-based heat-resistant stabilizers are preferred. The above-described heat-resistant stabilizers may be singly used or two or more heat-resistant stabilizers may be used in a mixed form.

The amount of the heat-resistant stabilizer added varies depending on the type of the heat-resistant stabilizers, but is preferably in a range of 0.005 parts by weight to 5 parts by weight with respect to 100 parts by weight of the polyolefin-based resin. When the amount of the heat-resistant stabilizer added is within the above-described range, it is possible to sufficiently ensure an effect that improves the resistance against a high temperature and a high humidity, the resistance against the heat cycle, and the heat-resistant stability, and to prevent the degradation of the transparency or adhesiveness to the transparent surface protective member, the back surface protective member, the cell, the electrode, and aluminum of the encapsulating material for a solar battery.

(Other Additives)

As the additives of the embodiment, a variety of additives other than the above-described additives can be appropriately included within the scope of the purpose of the invention. For example, it is possible to appropriately add one or more additives selected from a variety of resins other than the polyolefin-based resin, a variety of rubber, a plasticizer, a filler, a pigment, a dye, an antioxidant, an antistatic agent, an antimicrobial agent, an antifungal agent, a flame retardant, a light diffusion agent, a discoloration inhibitor, and a dispersant.

(Pellet Including the Polyolefin-based Resin as a Main Component)

There is no particular limitation regarding a method for manufacturing a pellet including the polyolefin-based resin as a main component in the embodiment, and examples thereof include a method in which the polyolefin-based resin is melted and kneaded using a uniaxial or biaxial extrusion molder so as to be extruded in a strand shape or a sheet shape, and the polyolefin-based resin is cut into a pellet shape so as to obtain a predetermined grain size using a pelletizer. Meanwhile, the pellet may appropriately include the above-described additives in advance within the scope of the purpose of the invention.

In addition, the average grain diameter in the pellet is preferably in a range of 0.2 mm to 10 mm. When the average grain diameter in the pellet is within the above-described range, the balance between the below-described stirring property of the pellet including the polyolefin-based resin as a main component and the soaking time of the additives into the pellet is excellent.

(Method for Manufacturing the Encapsulating Material Sheet for a Solar Battery)

Subsequently, the method for manufacturing an encapsulating material sheet for a solar battery of the embodiment will be described.

The method for manufacturing an encapsulating material sheet for a solar battery of the embodiment includes a step of producing an additive-containing pellet by soaking an additive A into the pellet including the polyolefin-based resin as a main component, a step of injecting the additive-containing pellet into a cylinder 103 from a supply opening 101 in an extrusion molder 100, and melting and kneading a resin composition including the polyolefin-based resin and the additive A in the cylinder 103, and a step of molding by extrusion the resin composition from a die 109 in the extrusion molder 100 into a sheet shape.

(Step of Preparing the Additive A)

The property of the additive A soaked into the pellet in advance is preferably a liquid form since the soaking property into the pellet is excellent.

In addition, it is preferable to prepare in advance the additive A by dissolving or dispersing at least one solid-form solid additive in a liquid-form liquid additive. When the solid additive is dissolved or dispersed in the liquid additive, it is possible to improve the soaking property of the solid additive into the pellet. At this time, a dilute solvent may be appropriately added to improve the dissolution property or dispersion property of the solid additive.

There is no particular limitation regarding the method for dissolving or dispersing the solid additive, and it is possible to prepare a solution including the additive by, for example, feeding the liquid additive into a stirring and mixing device such as a Henschel mixer, a tumbler mixer, a super mixer, or a rotary mixer, adding the solid additive to the liquid additive, and stirring and mixing the mixture.

There is no particular limitation regarding the temperature at which the mixture is stirred and mixed, and the temperature may be at room temperature or may be increased to a temperature in a range of approximately 30° C. to 120° C. to increase the stirring efficiency. When the temperature is more than or equal to the above-described lower limit value, the dissolution or dispersion rate of the solid additive can be improved, and therefore it is possible to improve the productivity of the encapsulating material sheet for a solar battery. In addition, when the temperature is less than or equal to the upper limit value, it is possible to suppress the degradation of the additive.

There is no particular limitation regarding the time of kneading and mixing, but it is preferable to knead and mix the mixture until the solid additive appears to be uniformly dissolved and dispersed.

Here, the liquid additive in the embodiment refers to a liquid-form additive at room temperature. There is no particular limitation regarding the liquid additive in the embodiment, but the liquid additive is mainly the organic peroxide, the silane coupling agent, and the crosslinking aid among the above-described additives.

In addition, the solid additive in the embodiment refers to a solid-form additive at room temperature. There is no particular limitation regarding the solid additive in the embodiment, but the solid additive is mainly the ultraviolet absorber, the heat-resistant stabilizer, and the light stabilizer among the above-described additives.

(Step of Producing the Additive-containing Pellet)

Next, the step of producing the additive-containing pellet by soaking the additive A into the pellet including the polyolefin-based resin as a main component will be described.

First, the pellets including the polyolefin-based resin as a main component and the prepared additive A are supplied to a stirring and mixing device, for example, a Henschel mixer, a tumbler mixer, a super mixer, or a rotary mixer.

Next, the pellet including the polyolefin-based resin as a main component and the additive A are brought into contact with each other by stirring the stirring and mixing device so as to soak the additive A into the pellet and produce the additive-containing pellet. Meanwhile, the pellet is preferably supplied in the full amount before the stirring and mixing device is rotated. On the other hand, the additive A may be supplied in the full amount before the stirring and mixing device is rotated or may be supplied part by part. The additive A is preferably supplied part by part to the stirring and mixing device since the additive A can be more uniformly soaked into the pellet.

The motor power value of the stirring and mixing device during the stirring and mixing and the integrated motor power value of the stirring and mixing device during the stirring and mixing are matters of design that can be determined depending on the soaking rate or treatment amount of the additive.

There is no particular limitation regarding the temperature of the pellet when the additive A is soaked into the pellet including the polyolefin-based resin as a main component, and the temperature may be at room temperature or may be increased to a temperature in a range of approximately 30° C. to 50° C. to increase the soaking rate. When the temperature is more than or equal to the above-described lower limit value, it is possible to improve the soaking rate of a solution including the additive into the pellet, and therefore it is possible to improve the productivity of the encapsulating material sheet for a solar battery. In addition, when the temperature is less than or equal to the upper limit value, it is possible to further suppress the deterioration of the additive. In addition, it is possible to further suppress the fusion between the pellets or the fusion of the pellet to the stirring and mixing device. The temperature of the pellet refers to the surface temperature of the pellet.

There is no particular limitation regarding the soaking time of the additive A into the pellet including the polyolefin-based resin as a main component since the soaking time varies depending on the treatment amount, but the soaking time is preferably in a range of 0.2 hours to 3 hours, and more preferably in a range of 0.3 hours to 2 hours. When the time is more than or equal to the above-described lower limit value, it is possible to sufficiently soak the additive A into the inside of the pellet. When the time is less than or equal to the above-described upper limit value, it is possible to further suppress the inactivation of the additive. Meanwhile, whether or not the soaking of the additive A into the pellet is completed can be checked using the motor power value of the stirring and mixing device. When the soaking is completed, moisture in the pellet is removed, and therefore the power value of the motor abruptly increases. Even for a resin having a slow soaking rate of the additive A such as the polyolefin-based resin, it is possible to check whether or not the soaking of the additive is completed by checking the motor power value.

According to the method for manufacturing an encapsulating material sheet for a solar battery of the embodiment, when the additive A is soaked in advance into the pellet including the polyolefin-based resin as a main component, it is possible to uniformly distribute the additive A in the pellet while suppressing the deterioration of the additive A. Therefore, it is possible to stably obtain an encapsulating material sheet for a solar battery in which the additive A is uniformly dispersed.

(Step of Melting and Kneading the Resin Composition)

Next, the step of injecting the additive-containing pellet into the cylinder 103 from the supply opening 101 in the extrusion molder 100, and melting and kneading the resin composition including the polyolefin-based resin and the additive A in the cylinder 103 will be described.

A variety of well-known biaxial or uniaxial extrusion molders can be used as the extrusion molder 100 in the embodiment. The extrusion molder is preferably a biaxial extrusion molder in terms of the excellent kneading performance.

As illustrated in FIG. 1, the extrusion molder 100 includes, for example, the supply opening 101 through which the additive-containing pellet can be injected into the cylinder 103 in the uppermost stream section, a screw 105 disposed in the cylinder 103, and a die 109 such as a T die or a ring die at the front end section of the lowermost downstream.

Figure 2:
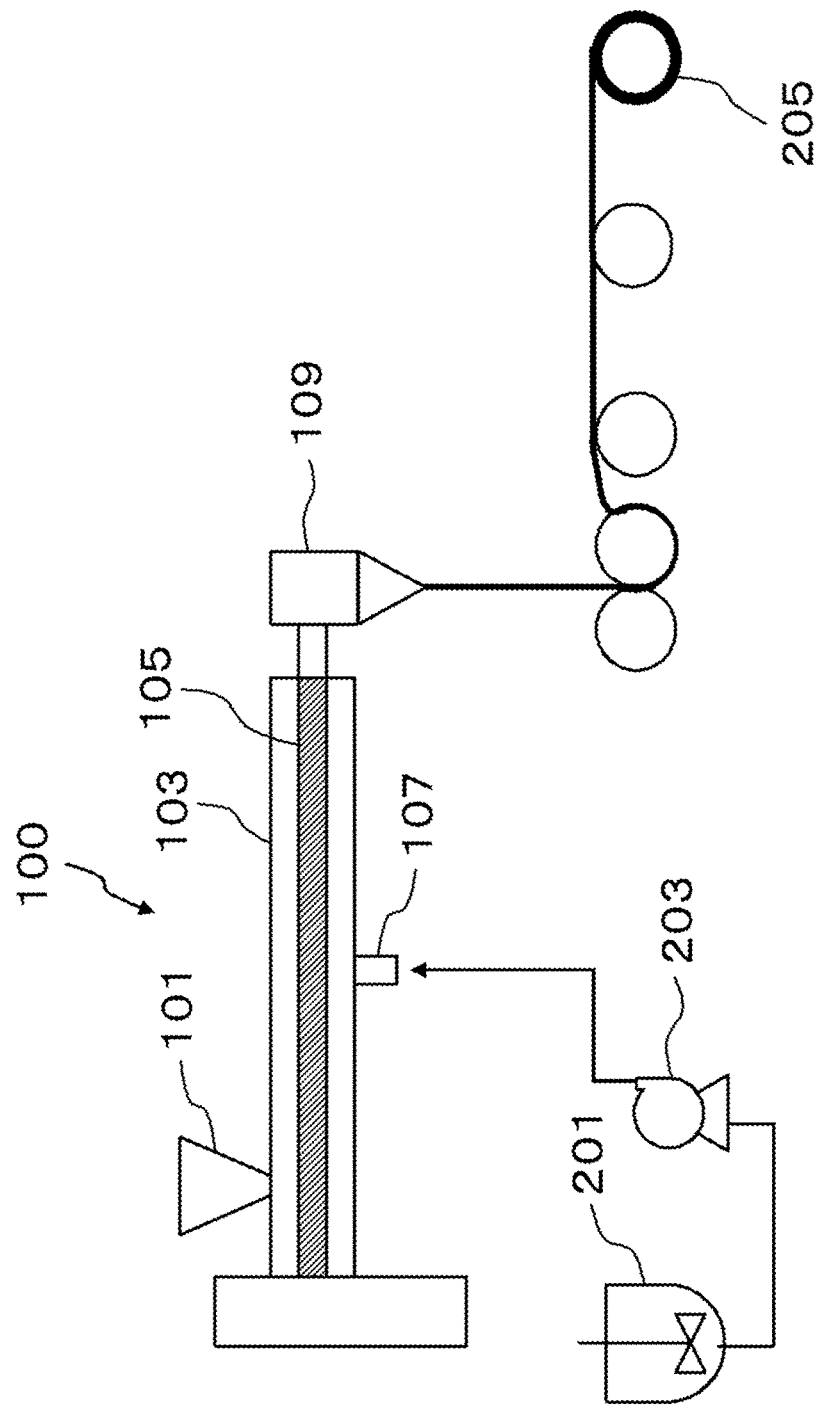
FIG. 2 is a schematic view of a manufacturing facility for carrying out a method for manufacturing an encapsulating material sheet for a solar battery of the first embodiment or a second embodiment according to the invention.

In addition, as illustrated in FIG. 2, an infusion nozzle 107 capable of infusing an additive B may be provided between the supply opening 101 and the front end of the screw 105.

First, the additive-containing pellet is injected into the cylinder 103 from the supply opening 101. Next, the additive-containing pellet injected into the cylinder 103 is heated and melted using a heater disposed outside the cylinder 103, and is melted and kneaded using the rotating screw 105.

(Step of Further Adding the Additive B to the Cylinder)

In the step of melting and kneading the resin composition in the embodiment, it is preferable to further add the additive B that is identical to or different from the additive A to the cylinder 103 provided between the supply opening 101 and the front end of the screw 105 using the infusion nozzle 107. A well-known nozzle can be used as the infusion nozzle 107. The additive B is, for example, supplied to the infusion nozzle 107 from a container 201 using a supply pump 203.

At this time, the amount of the additive B in the obtained encapsulating material sheet for a solar battery can be adjusted by adjusting the addition rate of the additive B and the extrusion rate of the encapsulating material sheet for a solar battery.

Similar to the property of the additive A, the property of the additive B is preferably a liquid form since the soaking property into the pellet is excellent. The additive B can also be prepared using the same method as the method for the additive A, and it is preferable to prepare in advance the additive B by dissolving or dispersing at least one solid-form solid additive in a liquid-form liquid additive. The additive B may be prepared in the container 201, and may be supplied to the infusion nozzle 107 using the supply pump 203.

Then, the amount of the additive A that is soaked into the pellet in advance is decreased, the soaking time of the additive can be shortened, and the productivity of the encapsulating material sheet for a solar battery can be improved. Particularly, since the polyolefin-based resin has a slower soaking rate of the additive compared with a polar copolymer such as an ethylene/vinyl acetate copolymer, a method is effective in which the additive is added after being classified into the additive A that is soaked into the pellet in advance and the additive B that is added from the infusion nozzle 107. Then, it is possible to further improve the productivity of the encapsulating material sheet for a solar battery including the polyolefin-based resin as a main component.

There is no particular limitation regarding the amount of the additive B being added from the infusion nozzle 107, but is preferably in a range of more than or equal to 0.01 parts by weight and less than or equal to 10 parts by weight, and more preferably in a range of more than or equal to 0.1 parts by weight and less than or equal to 5 parts by weight with respect to 100 parts by weight of the polyolefin-based resin. When the amount of the additive B is within the above-described range, the balance between the uniformity of the additive in the sheet and the productivity of the sheet is superior.

In addition, it is preferable that the additive B being infused into the cylinder do not substantially include at least one of the organic peroxide and the silane coupling agent. Since these additives are dangerous substances, in a case in which the organic peroxide and the silane coupling agent are directly infused into the cylinder, a special facility is required in the extrusion molder as a safety measure. Therefore, when the additive B being infused into the cylinder does not substantially include the organic peroxide or the silane coupling agent, it is possible to simplify the production facility.

Meanwhile, in the embodiment, the additive A preferably includes at least one of the organic peroxide and the silane coupling agent as the liquid additives.

In addition, in the embodiment, the additive B preferably includes the crosslinking aid. Among the above-described liquid additives, the crosslinking aid has a slower soaking rate into the polyolefin-based resin than other liquid additives. Therefore, when the crosslinking aid is included in the additive B being infused into the cylinder, it is possible to decrease the amount of the crosslinking aid in the additive A that is soaked into the pellet in advance. As a result, the soaking time of the additive A into the pellet can be shortened, and it is possible to further improve the productivity of the encapsulating material sheet for a solar battery including the polyolefin-based resin as a main component.

In the method for manufacturing an encapsulating material sheet for a solar battery of the embodiment, it is preferable that, with respect to 100 parts by weight of the polyolefin-based resin, the additive A include more than or equal to 0.1 parts by weight and less than or equal to 3.0 parts by weight of the organic peroxide and more than or equal to 0.1 parts by weight and less than or equal to 4.0 parts by weight of the silane coupling agent, and the additive B include more than or equal to 0.05 parts by weight and less than or equal to 5 parts by weight of the crosslinking aid. When the amounts of the organic peroxide, the silane coupling agent, and the crosslinking aid are within the above-described ranges, the soaking time of the additive A into the pellet can be further shortened, and it is possible to further improve the productivity of the encapsulating material sheet for a solar battery including the polyolefin-based resin as a main component.

Meanwhile, the method for manufacturing an encapsulating material sheet for a solar battery of the embodiment is particularly effective when a pellet including, as a main component, a polyolefin-based resin having a weight change rate of less than or equal to 3 weight % when being immersed in a liquid-form crosslinking aid at 50° C. for three hours is used as a raw material. Since the above-described polyolefin-based resin has a particularly slow soaking rate of the additive, the polyolefin-based resin and the additive are more insufficiently kneaded in the extrusion molder, and the additive is likely to segregate in the sheet. Therefore, in a case in which the above-described polyolefin-based resin is used, the method for manufacturing an encapsulating material sheet for a solar battery of the embodiment is particularly effective.

As the ratio of a polar group containing an oxygen atom, a nitrogen atom, and the like, which is contained in the polyolefin-based resin, decreases, the weight change rate decreases. Therefore, the method for manufacturing an encapsulating material sheet for a solar battery of the embodiment is particularly effective for the polyolefin-based resin having a small ratio of a polar group or substantially containing no polar group.

Meanwhile, the liquid-form crosslinking aid used when the weight change rate of the polyolefin-based resin with respect to the crosslinking aid is measured is, for example, triallyl isocyanurate.

(Step of Molding by Extrusion the Resin Composition into a Sheet Shape)

Lastly, the step of molding by extrusion the resin composition from the die 109 in the extrusion molder 100 into a sheet shape will be described.

While being melted and kneaded from the supply opening 101, the resin composition is extruded in a sheet shape from the die 109 such as a T die attached to the front end of the extrusion molder 100, thereby obtaining an encapsulating material sheet for a solar battery.

There is no particular limitation regarding the extrusion temperature, but the resin composition is preferably melted, kneaded, and extruded in a sheet shape at a temperature lower than the one-hour half-life temperature of the organic peroxide being used. Then, it is possible to suppress the inactivation of the organic peroxide.

Specifically, the extrusion temperature (cylinder temperature) is in a range of 100° C. to 130° C. When the extrusion temperature is set to be more than or equal to the above-described lower limit value, it is possible to improve the productivity of the encapsulating material for a solar battery. In addition, when the extrusion temperature is set to be less than or equal to the above-described upper limit value, it is possible to suppress the deterioration of the additive. In addition, it is possible to suppress the gelatinization of the encapsulating material for a solar battery.

As described above, in the method for manufacturing an encapsulating material sheet for a solar battery of the embodiment, the additive is passed through the inside of the extrusion molder 100 only once. Therefore, it is possible to suppress the heating of a variety of additives in the extrusion molder 100 or the inactivation of the additives due to the friction heat with screw blades, and to stably manufacture an encapsulating material sheet for a solar battery having excellent qualities.

In addition, in the method for manufacturing the encapsulating material sheet for a solar battery of the embodiment, it is preferable to carry out an embossing process on the surface of the sheet after the sheet is extruded in a sheet shape to improve the deaeration property.

A method for carrying out an embossing process on the surface of the sheet is not particularly limited, and a method of carrying out an embossing process on the surface while supplying a sheet extruded from a T die between an emboss roll which has embossing patterns on the surface and a rubber roll disposed to be opposed to the embossing roll, and pressing the embossing roll on a molten sheet can be exemplified. Further, the embossing process may be carried out by reheating and melting the obtained sheet.

It is preferable in terms of the productivity that the encapsulating material sheet for a solar battery extruded from the T die be cooled and solidified in a uniform thickness using a cooling roll, and be coiled using a coiling machine 205. At this time, the line speed is preferably high in consideration of the productivity, and can be selected so that the addition rate of the above-described additive B and extrusion rate become appropriate. The line speed is preferably more than or equal to 0.5 m/min, and more preferably more than or equal to 1 m/min.

In the embodiment, the obtained encapsulating material sheet for a solar battery can be used in a leaflet form that has been cut in accordance with the size of the solar battery module or in a roll form that can be cut in accordance with the size immediately before the solar battery module is produced.

The thickness of the encapsulating material sheet for a solar battery in the embodiment is not particularly limited, and is generally in a range of 0.01 mm to 2 mm, preferably in a range of 0.1 mm to 1.2 mm, and more preferably in a range of 0.3 mm to 0.9 mm. When the thickness is within the above-described range, it is possible to suppress the breakage of a glass, the solar battery element, the thin film electrode, and the like during the lamination step and to obtain a great light power generation amount by sufficiently ensuring light transmittance. Furthermore, the lamination molding of the solar battery module at a low temperature is possible, which is preferable.

The method for manufacturing a solar battery of the embodiment includes an encapsulating step in which a laminate is formed by sandwiching a solar battery cell using the encapsulating material sheet for a solar battery of the embodiment, and the laminate is integrated by applying a pressure using a pressing pressure in a range of more than or equal to 0.4 atmospheric pressures and less than or equal to 1 atmospheric pressure while the laminate is heated at a temperature in a range of more than or equal to 140° C. and less than or equal to 200° C. for 5 minutes to 30 minutes.

The laminate may be a laminate in which, for example, a transparent surface protective member (for example, a glass plate), a first encapsulating material sheet for a solar battery, the solar battery cell, a second encapsulating material sheet for a solar battery, and a back surface protective member (for example, a backsheet in which a variety of films are laminated) are laminated in this order. The configurations of the transparent surface protective member, the solar battery cell, and the back surface protective member can be realized according to the related art, and thus will not be described herein.

The details of other steps and the encapsulating step can be realized according to the related art.

(Second Embodiment)

Subsequently, a method for manufacturing an encapsulating material sheet for a solar battery of a second embodiment according to the invention will be described. In the second embodiment, the difference from the first embodiment will be mainly described, and the same matters will not be described.

FIG. 2 is a schematic view of a manufacturing facility for carrying out the method for manufacturing an encapsulating material sheet for a solar battery of the second embodiment according to the invention.

The method for manufacturing an encapsulating material sheet for a solar battery of the embodiment includes a step of producing a crosslinking agent-containing pellet by soaking a crosslinking agent into a resin pellet, a step of injecting the crosslinking agent-containing pellet into the cylinder 103 from the supply opening 101 in the extrusion molder 100, and melting and kneading a resin composition including a resin in the resin pellet and the crosslinking agent in the cylinder 103, a step of adding at least one additive of a crosslinking aid and a silane coupling agent to the cylinder 103 from the infusion nozzle 107 provided between the supply opening 101 and the front end of the screw 105, and a step of molding by extrusion the resin composition from the die 109 in the extrusion molder 100 into a sheet shape. In addition, the method for manufacturing an encapsulating material sheet for a solar battery of the embodiment may further include other steps such as a step of preparing a crosslinking agent.

The crosslinking aid or silane coupling agent added to the cylinder 103 is prepared in the container 201, and is supplied to the cylinder 103 using the supply pump 203. The resin composition on the obtained sheet is coiled around the coiling machine 205.

According to the method for manufacturing an encapsulating material sheet for a solar battery of the embodiment, when the crosslinking agent is soaked into the resin pellet in advance, it is possible to uniformly distribute the crosslinking agent in the pellet while suppressing the deterioration of the crosslinking agent. Therefore, it is possible to stably obtain an encapsulating material sheet for a solar battery in which the crosslinking agent is uniformly dispersed.

(Individual Materials Used for Manufacturing the Encapsulating Material Sheet for a Solar Battery)

The encapsulating material sheet for a solar battery obtained using the manufacturing method of the embodiment includes at least one additive of the resin in the resin pellet, the crosslinking agent, the crosslinking aid, and the silane coupling agent. Hereinafter, individual materials used for manufacturing the encapsulating material sheet for a solar battery of the embodiment will be described in detail.

(Resin Pellet)

The resin pellet is formed of a resin used for the encapsulating material sheet for a solar battery. Examples of the above-described resin include the polyolefin-based resins described in the first embodiment, ethylene/polar monomer copolymers, and the like. The method for manufacturing the resin pellet is not particularly limited, and examples thereof include a method in which the resin is melted and kneaded using a uniaxial or biaxial extrusion molder so as to be extruded in a strand shape or a sheet shape, and the resin is cut into a pellet shape so as to obtain a predetermined grain size using a pelletizer.

The average grain diameter in the resin pellet is preferably in a range of 0.2 mm to 10 mm. When the average grain diameter in the resin pellet is within the above-described range, the balance between the stirring property of the resin pellet and the soaking time of the additives into the resin pellet is excellent.

The polyolefin-based resin is particularly preferably an ethylene/α-olefin copolymer satisfying the following requirements a1 to a4:

a1) the content ratio of the structural unit derived from ethylene is in a range of 80 mol % to 90 mol %, and the content ratio of the structural unit derived from an α-olefin having 3 to 20 carbon atoms is in a range of 10 mol % to 20 mol %;

a2) the MFR, which is on the basis of ASTM D1238 and is measured under conditions of a temperature of 190° C. and a load of 2.16 kg, is in a range of 10 g/10 minutes to 50 g/10 minutes;

a3) the density, which is measured on the basis of ASTM D1505, is in a range of 0.865 $g/cm^3$ to 0.884 $g/cm^3$; and a4) the shore A hardness, which is measured on the basis of ASTM D2240, is in a range of 60 to 85.

Examples of the ethylene/polar monomer copolymer include ethylene/unsaturated ester copolymers, ethylene/vinyl acetate copolymers, and the like.

(Ethylene/Vinyl Acetate Copolymer)

The ethylene/vinyl acetate copolymer in the embodiment is a copolymer of ethylene and vinyl acetate, and is, for example, a random copolymer. From the viewpoint of obtaining an encapsulating material sheet for a solar battery having excellent adhesiveness, weather resistance, transparency, and mechanical properties, the ethylene/vinyl acetate copolymer in the embodiment preferably has a content ratio of the structural unit derived from ethylene, which is contained in the ethylene/vinyl acetate copolymer, in a range of 82 mol % to 92 mol %, and a content ratio of the structural unit derived from vinyl acetate, which is contained in the ethylene/vinyl acetate copolymer, in a range of 8 mol % to 18 mol %.

In addition, when the content ratios of the respective structural units are within the above-described ranges, film-forming properties also become favorable even when the encapsulating material sheet for a solar battery is formed. The content of the structural unit derived from vinyl acetate can be measured on the basis of JIS K6730.

The ethylene/vinyl acetate copolymer is preferably a binary copolymer made of only ethylene and vinyl acetate; however, in addition to the above-described monomers, may include, for example, a vinyl ester-based monomer such as vinyl formate, vinyl glycolate, vinyl propionate, or vinyl benzoate; or an acryl-based monomer such as acrylic acid, methacrylic acid, a salt thereof, or alkyl ester as a copolymerization component. In a case in which the above-described copolymerization component other than ethylene and vinyl acetate is included, the amount of the copolymerization component in all monomers of the ethylene/vinyl acetate copolymer is preferably set in a range of 0.5 weight % to 5 weight %.

The melt flow rate (MFR) of the ethylene/vinyl acetate copolymer in the embodiment, which is on the basis of ASTM D1238 and is measured under conditions of a temperature of 190° C. and a load of 2.16 kg, is preferably in a range of 5 g/10 minutes to 45 g/10 minutes, more preferably in a range of 5 g/10 minutes to 40 g/10 minutes, and still more preferably in a range of 10 g/10 minutes to 30 g/10 minutes. When the MFR is within the above-described range, a viscosity suitable for melting and mixing is obtained, which is preferable.

The resin being used may be a single resin or a mixture of two or more resins. Among the above-described resins, the ethylene/α-olefin copolymer or the ethylene/vinyl acetate copolymer is particularly preferred since the balance of a variety of characteristics required for the encapsulating material for a solar battery such as transparency, adhesiveness, flexibility, heat resistance, appearance, crosslinking characteristics, electrical characteristics, and extrusion moldability is excellent.

Examples of the crosslinking agent in the embodiment include the organic peroxide described in the first embodiment.

In addition, the same materials as described in the first embodiment can be used as other materials used for the manufacturing of the encapsulating material sheet for a solar battery of the embodiment. Here, the detail of the other materials will not be described.

In the method for manufacturing an encapsulating material sheet for a solar battery of the embodiment, it is preferable that, with respect to 100 parts by weight of the resin, more than or equal to 0.1 parts by weight and less than or equal to 3.0 parts by weight of the crosslinking agent (for example, the organic peroxide) and more than or equal to 0.05 parts by weight and less than or equal to 5 parts by weight of the crosslinking aid be included. When the contents are within the above-described ranges, the soaking time of the crosslinking agent into the pellet can be further shortened, and the productivity of the encapsulating material sheet for a solar battery can be further improved.

(Method for Manufacturing the Encapsulating Material Sheet for a Solar Battery)

Subsequently, the method for manufacturing an encapsulating material sheet for a solar battery of the embodiment will be described.

(Step of Preparing the Crosslinking Agent)

The step of preparing the crosslinking agent can be carried out according to the step of preparing the additive A in the first embodiment, and thus, herein, will not be described.

(Step of Producing the Crosslinking Agent-containing Pellet)

The step of producing the crosslinking agent-containing pellet is the same as the step of producing the additive-containing pellet in the first embodiment except for the fact that the crosslinking agent is used as the additive A, and thus, herein, will not be described.

In the present step, when a crosslinking agent prepared to include the additive is used, it is possible to soak the additive together with the crosslinking agent into the resin pellet.

(Step of Melting and Kneading the Resin Composition)

The step of melting and kneading the resin composition is the same as the step of melting and kneading the resin composition in the first embodiment except for the fact that the crosslinking agent is used as the additive A, and thus, herein, will not be described.

(Step of Adding at Least One of the Crosslinking Aid and the Silane Coupling Agent to the Cylinder)

The step of adding at least one of the crosslinking aid and the silane coupling agent to the cylinder is the same as the step of further adding the additive B to the cylinder in the first embodiment except for the fact that at least one of the crosslinking aid and the silane coupling agent is used as the additive B. Hereinafter, the difference from the first embodiment will be mainly described, and the same matters as in the first embodiment will not be repeated.

In the embodiment, at least one additive of the crosslinking aid and the silane coupling agent is further added to the cylinder 103 between the supply opening 101 and the front end of the screw 105 using the infusion nozzle 107. A well-known nozzle can be used as the infusion nozzle 107. At least one additive of the crosslinking aid and the silane coupling agent is, for example, supplied to the infusion nozzle 107 from the container 201 using the supply pump 203. At this time, the amount of the crosslinking aid and/or the silane coupling agent in the obtained encapsulating material sheet for a solar battery can be adjusted by adjusting the addition rate of at least one additive of the crosslinking aid and the silane coupling agent and the extrusion rate of the encapsulating material sheet for a solar battery.

Similar to the property of the crosslinking agent, the property of at least one additive of the crosslinking aid and the silane coupling agent is preferably a liquid form since the soaking property into the resin is excellent. Both the crosslinking aid and the silane coupling agent may be in a liquid form, or only one of the crosslinking aid and the silane coupling agent may be in a liquid form. In addition, at least one additive of the crosslinking aid and the silane coupling agent can be also prepared using the same method as for the crosslinking agent.

For example, in a case in which at least one additive of the crosslinking aid and the silane coupling agent includes a solid component and a liquid component, the solid component is dispersed or dissolved in the liquid component. Some or all of the solid additive or the liquid additive may be dispersed or dissolved in the liquid-form crosslinking agent or silane coupling agent. Then, a resin composition in which the crosslinking agent, the crosslinking aid, the silane coupling agent, other additives added as necessary, and the resin are uniformly mixed can be obtained.

Then, it is possible to decrease the amount of the crosslinking agent soaked into the pellet in advance, to shorten the soaking time of the additive, and to improve the productivity of the encapsulating material sheet for a solar battery. Particularly, since the polyolefin-based resin has a slower soaking rate of the additive compared with a polar copolymer such as an ethylene/vinyl acetate copolymer, a method is effective in which components being added to the resin are added after being classified into the crosslinking agent that is soaked into the resin pellet in advance and at least one additive of the crosslinking aid and the silane coupling agent that is added to the resin composition from the infusion nozzle 107. Then, it is possible to further improve the productivity of the encapsulating material sheet for a solar battery including the polyolefin-based resin as a main component.

There is no particular limitation regarding the amount of at least one additive of the crosslinking aid and the silane coupling agent being added from the liquid infusion nozzle 107, but is preferably in a range of more than or equal to 0.01 parts by weight and less than or equal to 10 parts by weight, and more preferably in a range of more than or equal to 0.1 parts by weight and less than or equal to 5 parts by weight with respect to 100 parts by weight of the resin. When the amount of the additive is within the above-described range, the balance between the uniformity of the additive in the sheet and the productivity of the sheet is superior.

In addition, it is preferable that at least one additive of the crosslinking aid and the silane coupling agent being infused into the cylinder 103 do not substantially include the organic peroxide. Since the organic peroxide is a dangerous substance, in a case in which the organic peroxide is directly infused into the cylinder 103, a special facility is required in the extrusion molder as a safety measure. Therefore, when at least one additive of the crosslinking aid and the silane coupling agent being infused into the cylinder 103 does not substantially include the organic peroxide, it is possible to simplify the production facility.

Among the above-described liquid additives, the crosslinking aid has a slower soaking rate in the resin than other liquid additives. Therefore, when the crosslinking aid is included in the additive being infused into the cylinder 103, it is possible to allow the crosslinking agent being soaked into the pellet in advance to include no crosslinking aid or only a small amount of the crosslinking aid. As a result, it is possible to shorten the soaking time of the crosslinking agent into the pellet, and to further improve the productivity of the encapsulating material sheet for a solar battery.

According to the method for manufacturing an encapsulating material sheet for a solar battery of the embodiment, it is possible to further shorten the retention time of at least one additive of the crosslinking aid and the silane coupling agent in the resin composition. Therefore, the reaction of either or both the crosslinking aid and the silane coupling agent due to the decomposed crosslinking agent or the reaction of the additive with the resin is suppressed, and it is possible to prevent gelatinization in the encapsulating material sheet for a solar battery or the occurrence of fisheye.

(Step of Molding by Extrusion the Resin Composition into a Sheet Shape)

The step of molding by extrusion the resin composition into a sheet shape is the same as the step of molding by extrusion the resin composition into a sheet shape in the first embodiment, and thus, herein, will not be described.

Other steps can be carried out according to the first embodiment, and thus, herein, will not be described.

According to the method for manufacturing an encapsulating material sheet for a solar battery of the second embodiment, it is possible to further shorten the retention time of at least one additive of the crosslinking aid and the silane coupling agent in the resin composition. Therefore, the reaction of either or both the crosslinking aid and the silane coupling agent due to the decomposed crosslinking agent or the reaction of the additive with the resin is suppressed, and it is possible to prevent gelatinization in the encapsulating material sheet for a solar battery or the occurrence of fisheye. As a result, it is possible to manufacture an encapsulating material sheet for a solar battery having excellent qualities with a high yield.

Thus far, the respective embodiments of the invention have been described, but the embodiments are simply examples of the invention, and it is still possible to employ a variety of configurations other than the above-described configuration.

Needless to say, the above-described respective embodiments can be combined together within the scope of the contents of the invention.

EXAMPLES

Hereinafter, the invention will be specifically described based on examples, but the invention is not limited to the examples.

First, examples regarding the first embodiment will be described below.

<Measurement Method>

(1) The content ratio of the ethylene unit and the α-olefin unit

After a solution obtained by heating and melting 0.35 g of a specimen in 2.0 ml of hexachlorobutadiene was filtered using a glass filter (G2), 0.5 ml of deuterated benzene was added, and the mixture was fed into an NMR tube having an inner diameter of 10 mm. The $^{13}$C-NMR was measured at 120° C. using a JNM GX-400-type NMR measurement device manufactured by JEOL, Ltd. The cumulated number was set to more than or equal to 8000 times. The content ratio of the ethylene unit and the content ratios of the α-olefin unit in the copolymer were determined from the obtained $^{13}$C-NMR spectra.

(2) MFR

The MFR of the ethylene/α-olefin copolymer was measured on the basis of ASTM D1238 under conditions of a temperature of 190° C. and a load of 2.16 kg.

(3) Density

The density of the ethylene/α-olefin copolymer was measured on the basis of ASTM D1505.

<Synthesis of the Ethylene/α-olefin Copolymer>

A toluene solution of methyl aluminoxane was supplied as a co-catalyst at a rate of 8.0 mmol/hr, and a hexane slurry of bis(1,3-dimethylcyclopentadienyl)zirconium dichloride and a hexane solution of triisobutylaluminum were supplied at rates of 0.025 mmol/hr and 0.5 mmol/hr respectively as main catalysts to one supply opening of a continuous polymerization vessel having stirring blades and an inner volume of 50 L, and normal hexane which was used as a catalyst solution and a polymerization solvent and was dehydrated and purified so that the total of the dehydrated and purified normal hexane became 20 L/hr was continuously supplied. At the same time, ethylene, 1-butene, and hydrogen were continuously supplied at rates of 3 kg/hr, 15 kg/hr, and 5 NL/hr respectively to another supply opening of the polymerization vessel, and continuous solution polymerization was carried out under conditions of a polymerization temperature of 90° C., a total pressure of 3 MPaG, and a retention time of 1.0 hour. The normal hexane/toluene solution mixture of the ethylene/α-olefin copolymer generated in the polymerization vessel was continuously exhausted through an exhaust opening provided in the bottom portion of the polymerization vessel, and was guided to a coupling pipe in which a jacket portion was heated using 3 kg/cm$^2$ to 25 kg/cm$^2$ of steam so that the normal hexane/toluene solution mixture of the ethylene/α-olefin copolymer reached a temperature in a range of 150° C. to 190° C.

Meanwhile, a supply opening through which methanol that was a catalyst-inactivating agent was infused was provided immediately before the coupling pipe, and methanol was infused at a rate of approximately 0.75 L/hr so as to combine with the normal hexane/toluene solution mixture of the ethylene/α-olefin copolymer. The normal hexane/toluene solution mixture of the ethylene/α-olefin copolymer maintained at a temperature of approximately 190° C. in the steam jacket-equipped coupling pipe was continuously sent to a flash chamber by adjusting the degree of the opening of a pressure control valve provided at the terminal portion of the coupling pipe so as to maintain approximately 4.3 MPaG. Meanwhile, when the normal hexane/toluene solution mixture was sent to the flash chamber, the solution temperature and the degree of the opening of the pressure-adjusting valve were set so that the pressure in the flash chamber was maintained at approximately 0.1 MPaG and the temperature of a vapor portion in the flash chamber was maintained at approximately 180° C. After that, a strand was cooled in a water vessel after passing through a single screw extruder in which the die temperature was set to 180° C., and the strand was cut using a pellet cutter, thereby obtaining an ethylene/α-olefin copolymer in a pellet form. The yield was 2.2 kg/hr. The properties of the obtained ethylene/α-olefin copolymer are described below.

Ethylene/1-butene=86/14 (mol %/mol %), density=0.870 g/cm$^3$, MFR (ASTM D1238, a temperature of 190° C., and a load of 2.16 kg)=20 g/10 minutes, shore A hardness=70, and weight change rate when immersed in triallyl isocyanurate at 50° C. for three hours=1.8%

Example 1

(Step of Preparing the Additive A1)

30 parts by weight of a liquid-form organic peroxide (t-butyl peroxy 2-ethylhexylcarbonate), 20 parts by weight of a silane coupling agent (vinyltriethoxysilane), and 40 parts by weight of a crosslinking aid (triallyl isocyanurate) were blended and stirred in a stirring vessel 1 having stirring blades and an inner volume of 50 L, 10 parts by weight of a powder-form light stabilizer (bis(2,2,6,6-tetramethyl-4-piperidyl)sebacate) was further blended in, and stirred at 35° C. for three hours, thereby preparing a sufficiently dissolved and mixed additive A1.

(Step of Producing the Additive-containing Pellet 1)

Next, a pellet of the above-described ethylene/α-olefin copolymer was injected into a 200 L inverted conical stirring vessel having spiral ribbon blades, 3 parts by weight of the additive A1 was added to 100 parts by weight of the pellet, and the components were stirred for one hour under heating at 40° C. Then, an additive-containing pellet 1 in a state in which the additive A1 was soaked and dried in the pellet of the ethylene/α-olefin copolymer was obtained.

(Step of Producing a Sheet)

Next, the above-described additive-containing pellet 1 was supplied to the cylinder from the raw material supply opening in a biaxial extrusion molder (manufactured by the Japan Steel Works, Ltd., TEX44C-30AW, screw diameter: 44 mm) using a gravimetric feeder. The extruder included a T die (width: 900 mm), and the extruded molten sheet was cooled and solidified using a cooling roll, and then was coiled.

At this time, the supply rate of the additive-containing pellet 1 was set to 20 kg/hr, the extrusion rate was set to 20 kg/hr, the cylinder temperature was set to 110° C., the die temperature was set to 100° C., the cooling roll temperature was set to 18° C., and the line speed was set to 1 m/min, and a resin sheet having an average thickness of 0.5 mm was obtained. The resin temperature at the T die outlet was 105° C.

Example 2

(Step of Preparing the Additive A2)

60 parts by weight of an organic peroxide (t-butyl peroxy 2-ethylhexylcarbonate) and 40 parts by weight of a silane coupling agent (vinyltriethoxysilane) were blended and stirred at room temperature for 30 minutes in a stirring vessel 1 having stirring blades and an inner volume of 50 L, thereby preparing a sufficiently stirred and mixed additive A2.

(Step of Producing the Additive-containing Pellet 2)

Next, a pellet of the above-described ethylene/α-olefin copolymer was injected into a 200 L inverted conical stirring vessel having spiral ribbon blades, 1.5 parts by weight of the additive A2 was added to 100 parts by weight of the pellet, and the components were stirred for 30 minutes under heating at 40° C. Then, an additive-containing pellet 2 in a state in which the additive A2 was soaked and dried in the pellet of the ethylene/α-olefin copolymer was obtained.

(Step of Preparing the Additive B)

Next, 70 parts by weight of a crosslinking aid (triallyl isocyanurate) and 30 parts by weight of a powder-form light stabilizer (bis(2,2,6,6-tetramethyl-4-piperidyl)sebacate) were blended and stirred at 35° C. for two hours in a stirring vessel 2 having stirring blades and an inner volume of 50 L, thereby preparing a sufficiently dissolved and mixed additive B.

(Step of Producing a Sheet)

Next, the above-described additive-containing pellet 2 was supplied to the cylinder from the raw material supply opening in a biaxial extrusion molder (manufactured by the Japan Steel Works, Ltd., TEX44C-30AW, screw diameter: 44 mm) using a gravimetric feeder.

Furthermore, the additive B was supplied to the infusion nozzle mounted in the middle section between the raw material supply opening and the screw front end at a piston reciprocal speed of 60 rpm using a single plunger pump, and the additive B was infused into the cylinder from the infusion nozzle. At this time, the amount of the additive B added was adjusted to be 1 part by weight with respect to 100 parts by weight of the ethylene/α-olefin copolymer. The extruder included a T die (width: 900 mm), and the extruded molten sheet was cooled and solidified using a cooling roll, and then was coiled.

At this time, the supply rate of the additive-containing pellet 2 was set to 20 kg/hr, the extrusion rate was set to 20 kg/hr, the cylinder temperature was set to 110° C., the die temperature was set to 100° C., the cooling roll temperature was set to 18° C., and the line speed was set to 1 m/min, and a resin sheet having an average thickness of 0.5 mm was obtained. The resin temperature at the T die outlet was 103° C.

Example 3

(Step of Preparing the Additive A3)

33 parts by weight of a liquid-form organic peroxide (t-butyl peroxy 2-ethylhexylcarbonate), 22 parts by weight of a silane coupling agent (vinyltriethoxysilane), and 45 parts by weight of a crosslinking aid (triallyl isocyanurate) were blended and stirred at room temperature for 30 minutes in a stirring vessel 1 having stirring blades and an inner volume of 50 L, thereby preparing a sufficiently mixed additive A3.

(Step of Producing the Additive-containing Pellet 3)

Next, a pellet of the above-described ethylene/α-olefin copolymer was held in a 200 L inverted conical stirring vessel having spiral ribbon blades, 2.7 parts by weight of the additive A3 was added to 100 parts by weight of the pellet, and the components were stirred for three hours under heating at 40° C. Then, an additive-containing pellet 3 in a state in which the additive A3 was soaked and dried in the pellet of the ethylene/α-olefin copolymer was obtained.

(Step of Producing a Sheet)

Next, the above-described additive-containing pellet 3 was supplied to the cylinder from the raw material supply opening in a biaxial extrusion molder (manufactured by the Japan Steel Works, Ltd., TEX44C-30AW, screw diameter: 44 mm) using a gravimetric feeder.

Furthermore, the supply amount per unit time of a powder-form light stabilizer (bis(2,2,6,6-tetramethyl-4-piperidyl)sebacate) was calculated so that the content reached 0.3 parts by weight with respect to 100 parts by weight of the ethylene/α-olefin copolymer, and the light stabilizer was supplied to the raw material supply opening in the extrusion molder. The extruder included a T die (width: 900 mm), and the extruded molten sheet was cooled and solidified using a cooling roll, and then was coiled.

At this time, the supply rate of the additive-containing pellet 3 was set to 20 kg/hr, the extrusion rate was set to 20 kg/hr, the cylinder temperature was set to 110° C., the die temperature was set to 100° C., the cooling roll temperature was set to 18° C., and the line speed was set to 1 m/min, and a resin sheet having an average thickness of 0.5 mm was obtained. The resin temperature at the T die outlet was 105° C.

<Uniformity of the Additive>

Small pieces were sampled at five points at intervals of one meter in the flow direction from the sheets obtained in Examples 1 to 3, and were extracted using a solvent, and the amounts of the light stabilizer (bis(2,2,6,6-tetramethyl-4-piperidyl)sebacate) were determined using gas chromatography. The results are described in Table 1. 'No.' in Table 1 indicates a sample number, and the units of numeric values are 'parts by weight'.

In Examples 1 to 3, the sheets were prepared so that all the amounts of the light stabilizer reached approximately 0.3 parts by weight with respect to 100 parts by weight of the ethylene/α-olefin copolymer. The light stabilizer was more uniformly distributed in the sheet in which the light stabilizer had been dissolved in the liquid additive in advance.

TABLE 1

| No. | Example 1 | Example 2 | Example 3 |
|---|---|---|---|
| 1 | 0.30 | 0.29 | 0.23 |
| 2 | 0.30 | 0.30 | 0.14 |
| 3 | 0.29 | 0.29 | 0.48 |
| 4 | 0.30 | 0.30 | 0.22 |
| 5 | 0.30 | 0.30 | 0.14 |

<Soaking Time of the Additive A into the Pellet>

The soaking time of the additive A into the pellet was measured using the power value of the stirring motor in the 200 L inverted conical stirring vessel having ribbon blades that carried out the soaking into the pellet. In a state in which the additive A was not fully soaked, the additive attached to the pellet surface served as a lubricant, and the motor value of the stirring motor stirring the pellet became small. On the other hand, when the additive A was fully soaked, there was no lubricating effect, and the power value of the stirring motor abruptly increased. Therefore, in the transition graph of the power value of the stirring motor, the inflection point at which the curve was increased and stabilized was used as a point in time at which the soaking was completed, and the soaking time of the additive A into the pellet was computed. The results are described in Table 2.

From Table 2, it could be confirmed that, in a case in which the crosslinking aid was added afterwards to the cylinder from the infusion nozzle, the soaking time was significantly decreased. That is, when additives other than the organic peroxide and the silane coupling agent were added afterwards, the soaking time of the additive A was shortened, and the productivity was further improved.

TABLE 2

| | Example 1 | Example 2 | Example 3 |
|---|---|---|---|
| Soaking time [min] | 140 | 27 | 120 |

Subsequently, examples regarding the second embodiment will be described below.

Example 4

(Step of Preparing the Additive A4)

77 parts by weight of a crosslinking agent (2,5-dimethyl-2,5-di(t-butyl peroxy)hexane), 15 parts by weight of a solid-form ultraviolet absorber (2-hydroxy-4-n-octoxybenzophenone), and 8 parts by weight of a light stabilizer (bis(2,2,6,6-tetramethyl-4-piperidyl)sebacate) were blended in a stirring vessel having stirring blades and an inner volume of 50 L. The blended substance was stirred at room temperature for 30 minutes, thereby preparing a sufficiently stirred and dissolved crosslinking agent-containing additive A4.

(Step of Producing the Crosslinking Agent-containing Pellet 4)

A pellet of an ethylene/vinyl acetate copolymer (a content of vinyl acetate: 27 weight %, MFR: 16.8 g/10 minutes) was injected into a 200 L inverted conical stirring vessel having spiral ribbon blades. 1.3 parts by weight of the crosslinking agent-containing additive A4 was added to 100 parts by weight of the pellet, and the components were stirred for 30 minutes under heating at 40° C. Then, a crosslinking agent-containing pellet 4 in a state in which the crosslinking agent was soaked and dried in the pellet of the ethylene/vinyl acetate was obtained.

(Step of Preparing the Additive B4)

Next, 60 parts by weight of a crosslinking aid 1 (triallyl isocyanurate), 20 parts by weight of a crosslinking aid 2 (pentaerythritol triacrylate), and 20 parts by weight of a silane coupling agent (γ-methacryloxypropyl trimethoxysilane) were blended in a stirring vessel having stirring blades and an inner volume of 50 L. The blended substance was stirred at room temperature for 30 minutes, thereby preparing a sufficiently stirred and mixed additive B4.

(Step of Producing a Sheet)

The above-described crosslinking agent-containing pellet 4 was supplied to the cylinder from the raw material supply opening in a biaxial extrusion molder as illustrated in FIG. 2 (manufactured by the Japan Steel Works, Ltd., TEX44C-30AW, screw diameter: 44 mm) using a gravimetric feeder. Furthermore, the additive B4 was supplied to the infusion nozzle mounted in the middle section between the raw material supply opening and the screw front end at a piston reciprocal speed of 60 rpm using a single plunger pump. The amount of the additive B4 added was adjusted to be 2.5 parts by weight with respect to 100 parts by weight of the crosslinking agent-containing pellet 4. The extrusion molder included a T die (width: 900 mm), and the extruded molten sheet was cooled and solidified using a cooling roll, and then was coiled. At this time, the supply rate of the crosslinking agent-containing pellet 4 was set to 20 kg/hr, the extrusion rate was set to 20 kg/hr, the cylinder temperature was set to 110° C., the die temperature was set to 100° C., the cooling roll temperature was set to 18° C., and the line speed was set to 1 m/min, and a resin sheet having an average thickness of 0.5 mm was obtained.

Example 5

(Step of Producing the Crosslinking Agent-containing Pellet 5)

A pellet of an ethylene/vinyl acetate copolymer (a content of vinyl acetate: 27 weight %, MFR: 16.8 g/10 minutes) was injected into a 200 L inverted conical stirring vessel having spiral ribbon blades. 1 part by weight of 2,5-dimethyl-2,5-di(t-butyl peroxy) hexane was added as a crosslinking agent to 100 parts by weight of the pellet. The contents were stirred for 30 minutes under heating at 40° C. Then, a crosslinking agent-containing pellet 5 in a state in which the crosslinking agent was soaked and dried in the pellet of the ethylene/vinyl acetate copolymer was obtained.

(Step of Preparing the Additive B5)

Next, 53.5 parts by weight of a crosslinking aid 1 (triallyl isocyanurate), 18 parts by weight of a crosslinking aid 2 (pentaerythritol triacrylate), 18 parts by weight of a silane coupling agent (γ-methacryloxypropyl trimethoxysilane), 7 parts by weight of a solid ultraviolet absorber (2-hydroxy-4-n-octoxybenzophenone), and 3.5 parts by weight of a light stabilizer (bis(2,2,6,6-tetramethyl-4-piperidyl)sebacate) were blended in a stirring vessel having stirring blades and an inner volume of 50 L. The blended substance was stirred at room temperature for 30 minutes, thereby preparing a sufficiently dissolved and mixed additive B5.

(Step of Producing a Sheet)

The crosslinking agent-containing pellet 5 was supplied to the cylinder from the raw material supply opening in a biaxial extrusion molder (manufactured by the Japan Steel Works, Ltd., TEX44C-30AW, screw diameter: 44 mm) using a gravimetric feeder. Furthermore, the additive B5 was supplied to the infusion nozzle mounted in the middle section between the raw material supply opening and the screw front end at a piston reciprocal speed of 60 rpm using a single plunger pump. The amount of the additive B5 added was adjusted to be 2.8 parts by weight with respect to 100 parts by weight of the crosslinking agent-containing pellet 5. The extrusion molder included a T die (width: 900 mm), and the extruded molten sheet was cooled and solidified using a cooling roll, and then was coiled. At this time, the supply rate of the crosslinking agent-containing pellet 5 was set to 20 kg/hr, the extrusion rate was set to 20 kg/hr, the cylinder temperature was set to 110° C., the die temperature was set to 100° C., the cooling roll temperature was set to 18° C., and the line speed was set to 1 m/min, and a resin sheet having an average thickness of 0.5 mm was obtained.

Example 6

(Step of Preparing the Additive A6)

77 parts by weight of a crosslinking agent (2,5-dimethyl-2,5-di(t-butyl peroxy)hexane), 15 parts by weight of a solid ultraviolet absorber (2-hydroxy-4-n-octoxybenzophenone), and 8 parts by weight of a light stabilizer (bis(2,2,6,6-tetramethyl-4-piperidyl)sebacate) were blended in a stirring vessel having stirring blades and an inner volume of 50 L. The blended substance was stirred at room temperature for 30 minutes, thereby preparing a sufficiently stirred and dissolved crosslinking agent-containing additive A6.

(Step of Producing the Crosslinking Agent-containing Pellet 6)

A pellet of an ethylene/butene copolymer (ethylene/1-butene=86/14 (mol), density=0.870 g/cm$^3$, MFR (ASTM D1238, a temperature of 190° C., and a load of 2.16 kg)=20 g/10 minutes, shore A hardness=70, and weight change rate when immersed in triallyl isocyanurate at 50° C. for three hours=1.8%) was injected into a 200 L inverted conical stirring vessel having spiral ribbon blades. Furthermore, 1.3 parts by weight of the additive A6 was added to 100 parts by weight of the pellet, and the components were stirred for 30 minutes under heating at 40° C. Then, a crosslinking agent-containing pellet 6 in a state in which the crosslinking agent was soaked and dried in the pellet of the ethylene/butene copolymer was obtained.

(Step of Preparing the Additive B6)

Next, 60 parts by weight of a crosslinking aid 1 (triallyl isocyanurate), 20 parts by weight of a crosslinking aid 2 (pentaerythritol triacrylate), and 20 parts by weight of a silane coupling agent (γ-methacryloxypropyl trimethoxysilane) were blended in a stirring vessel having stirring blades and an inner volume of 50 L. The blended substance was stirred at room temperature for 30 minutes, thereby preparing a sufficiently stirred and mixed additive B6.

(Step of Producing a Sheet)

The crosslinking agent-containing pellet 6 was supplied to the cylinder from the raw material supply opening in a biaxial extrusion molder (manufactured by the Japan Steel Works, Ltd., TEX44C-30AW, screw diameter: 44 mm) using a gravimetric feeder. Furthermore, the additive B6 was supplied to the infusion nozzle mounted in the middle section between the raw material supply opening and the screw front end at a piston reciprocal speed of 60 rpm using a single plunger pump. The amount of the additive B6 added was adjusted to be 2.5 parts by weight with respect to 100 parts by weight of the crosslinking agent-containing pellet 6. The extrusion molder included a T die (width: 900 mm), and the extruded molten sheet was cooled and solidified using a cooling roll, and then was coiled. At this time, the supply rate of the crosslinking agent-containing pellet 6 was set to 20 kg/hr, the extrusion rate was set to 20 kg/hr, the cylinder temperature was set to 110° C., the die temperature was set to 100° C., the cooling roll temperature was set to 18° C., and the line speed was set to 1 m/min, and a resin sheet having an average thickness of 0.5 mm was obtained.

The crosslinking characteristics and fisheye of the resin sheets obtained in the respective examples were evaluated using the following methods (1) and (2). The evaluation results are described in Table 3.

(1) Crosslinking Characteristics Variation

Specimens (1.5 g each) were sampled from a total of 24 positions (eight points at intervals of 10 cm in the TD direction in each of three lines separated at intervals of 10 cm in the MD direction) in the roll-shaped resin sheet. Next, the specimens from the respective sampling positions were heated under five-minute pressurization using a compression molder at 150° C., thereby obtaining crosslinked sheets. 1 g of a specimen was sampled from each of the crosslinked sheets, was immersed in 100 ml of xylene, and was heated at 110° C. for 12 hours. After that, non-dissolved components were captured through filtration using a metal net, and the specimen was dried and weighed. The gel fraction at each position was obtained, and the variation of the crosslinking characteristics was evaluated using the following formula.

Maximum variation amount (%)=(the maximum value of the gel fraction (%))−(the minimum value of the gel fraction (%))

A: the maximum variation amount is less than 5%

B: the maximum variation amount is more than or equal to 5%

(2) Fisheye

The occurrence status of fisheye in the obtained resin sheet was visually evaluated using the following evaluation standards.

A: fisheye rarely occurs, and the appearance is favorable

B: fisheye is slightly shown, and the appearance is almost favorable

C: a large amount of fisheye is observed, and the appearance is poor

TABLE 3

|  | Example 4 | Example 5 | Example 6 |
|---|---|---|---|
| Crosslinking characteristics variation | A | A | A |
| Fisheye | A | A | A |

Hereinafter, an example of a reference form will be additively described.

[1] A method for manufacturing an encapsulating material sheet for a solar battery, including:

a step of producing a crosslinking agent-containing pellet by soaking a crosslinking agent into a resin pellet;

a step of injecting the crosslinking agent-containing pellet into a cylinder from a supply opening in an extrusion molder, and melting and kneading a resin composition including a resin in the resin pellet and the crosslinking agent in the cylinder;

a step of adding a crosslinking aid and/or a silane coupling agent to the cylinder from an infusion nozzle provided between the supply opening and a front end of a screw; and a step of molding by extrusion the resin composition from a die in the extrusion molder into a sheet shape.

[2] The method for manufacturing an encapsulating material sheet for a solar battery according to the above-described [1], in which the crosslinking agent is a liquid-form organic peroxide.

[3] The method for manufacturing an encapsulating material sheet for a solar battery according to the above-described [2], in which, in the step of producing the crosslinking agent-containing pellet, a solid additive that is different from the crosslinking agent is further soaked into the resin pellet.

[4] The method for manufacturing an encapsulating material sheet for a solar battery according to the above-described [3], in which the solid additive is soaked into the resin pellet by being dissolved or dispersed in the crosslinking agent.

[5] The method for manufacturing an encapsulating material sheet for a solar battery according to the above-described [3] or [4], in which the solid additive is at least one additive selected from a group consisting of an ultraviolet absorber, a heat-resistant stabilizer, and a light stabilizer.

[6] The method for manufacturing an encapsulating material sheet for a solar battery according to any one of the above-described [1] to [5], in which the crosslinking agent is selected from 2,5-dimethyl-2,5-di(t-butylperoxy) hexane, t-butylperoxy-2-ethylhexyl carbonate, 1,1-di(t-butylperoxy) cyclohexane, and t-butyl-peroxy benzoate.

[7] The method for manufacturing an encapsulating material sheet for a solar battery according to any one of the above-described [1] to [6], in which the crosslinking agent and/or the silane coupling agent is in a liquid form.

[8] The method for manufacturing an encapsulating material sheet for a solar battery according to any one of the above-described [1] to [7], in which the crosslinking agent and/or the silane coupling agent include a solid component and a liquid component, and the crosslinking agent and/or the silane coupling agent are added to the cylinder by dispersing or dissolving the solid component in the liquid component.

[9] The method for manufacturing an encapsulating material sheet for a solar battery according to any one of the above-described [1] to [8], in which the resin pellet is made of an ethylene-based polymer.

[10] The method for manufacturing an encapsulating material sheet for a solar battery according to the above-described [9], in which the ethylene-based polymer is selected from an ethylene/α-olefin copolymer and an ethylene/vinyl acetate copolymer.

[11] The method for manufacturing an encapsulating material sheet for a solar battery according to the above-described [10], in which the ethylene/α-olefin copolymer includes a structural unit derived from ethylene and a structural unit derived from an α-olefin having 3 to 20 carbon atoms, a content ratio of the structural unit derived from ethylene is in a range of 80 mol % to 90 mol %, and a content ratio of the structural unit derived from an α-olefin having 3 to 20 carbon atoms is in a range of 10 mol % to 20 mol %.

[12] The method for manufacturing an encapsulating material sheet for a solar battery according to the above-described [10] or [11], in which the ethylene/α-olefin copolymer has a weight change rate of less than or equal to 3 weight % when immersed in the liquid-form crosslinking aid at 50° C. for three hours.

[13] The method for manufacturing an encapsulating material sheet for a solar battery according to the above-described [10], in which the ethylene/vinyl acetate copolymer has a content ratio of the structural unit derived from ethylene, which is contained in the ethylene/vinyl acetate copolymer, in a range of 82 mol % to 92 mol %, and a content ratio of the structural unit derived from vinyl acetate, which is contained in the ethylene/vinyl acetate copolymer, in a range of 8 mol % to 18 mol %.

[14] The method for manufacturing an encapsulating material sheet for a solar battery according to any one of the above-described [9] to [13], in which the encapsulating material sheet for a solar battery includes 0.1 parts by weight to 3.0 parts by weight of the crosslinking agent and 0.05 parts by weight to 5 parts by weight of the crosslinking aid and/or the silane coupling agent with respect to 100 parts by weight of the ethylene-based polymer.

[15] The method for manufacturing an encapsulating material sheet for a solar battery according to any one of the above-described [1] to [14], in which, in the step of producing the crosslinking agent-containing pellet, the crosslinking agent is soaked into the resin pellet by supplying the resin pellet and the crosslinking agent to a stirring and mixing device, and stirring and mixing the resin pellet and the crosslinking agent.

[16] The method for manufacturing an encapsulating material sheet for a solar battery according to any one of the above-described [1] to [15], in which the crosslinking aid is triallyl isocyanurate and/or a liquid-form (meth)acrylate compound.

The present application claims priority based on Japanese Patent Application No. 2012-103386 filed on Apr. 27, 2012 and Japanese Patent Application No. 2012-169595 filed on Jul. 31, 2012, the contents of which are incorporated herein by reference.

The invention claimed is:

1. A method for manufacturing an encapsulating material sheet for a solar battery, comprising:
a step of producing an additive-containing pellet by soaking an additive A into a pellet including a polyolefin-based resin as a main component;
a step of injecting the additive-containing pellet into a cylinder from a supply opening in an extrusion molder, and melting and kneading a resin composition including the polyolefin-based resin and the additive A in the cylinder; and
a step of molding by extrusion the resin composition from a die in the extrusion molder into a sheet shape,
wherein the additive A includes at least one liquid additive selected from a group consisting of an organic peroxide and a silane coupling agent,
wherein, in the melting and kneading step,
an additive B that is identical to or different from the additive A is further added to the cylinder from an infusion nozzle provided between the supply opening and a front end of a screw,
wherein the additive B includes a crosslinking aid.

2. The method for manufacturing an encapsulating material sheet for a solar battery according to claim 1,
wherein the additive A is prepared by dispersing or dissolving at least one solid additive in the liquid additive.

3. The method for manufacturing an encapsulating material sheet for a solar battery according to claim 2,
wherein the solid additive is at least one additive selected from a group consisting of an ultraviolet absorber, a heat-resistant stabilizer, and a light stabilizer.

4. The method for manufacturing an encapsulating material sheet for a solar battery according to claim 1,
wherein the additive B is in a liquid form.

5. The method for manufacturing an encapsulating material sheet for a solar battery according to claim 1,
wherein the additive B is prepared by dispersing or dissolving at least one solid additive in a liquid additive.

6. The method for manufacturing an encapsulating material sheet for a solar battery according to claim 1,
wherein the additive B does not substantially include at least one additive selected from a group consisting of an organic peroxide and a silane coupling agent.

7. The method for manufacturing an encapsulating material sheet for a solar battery according to claim 1,
wherein, with respect to 100 parts by weight of the polyolefin-based resin,
the additive A includes more than or equal to 0.1 parts by weight and less than or equal to 3.0 parts by weight of the organic peroxide and more than or equal to 0.1 parts by weight and less than or equal to 4.0 parts by weight of the silane coupling agent, and
the additive B includes more than or equal to 0.05 parts by weight and less than or equal to 5 parts by weight of the crosslinking aid.

8. The method for manufacturing an encapsulating material sheet for a solar battery according to claim 1,
wherein, in the step of producing the additive-containing pellet,
the pellet and the additive A are supplied to a stirring and mixing device, and are stirred and mixed, thereby soaking the additive A into the pellet.

9. The method for manufacturing an encapsulating material sheet for a solar battery according to claim 8,
wherein a soaking state of the additive A into the pellet is confirmed using a motor power value of the stirring and mixing device.

10. The method for manufacturing an encapsulating material sheet for a solar battery according to claim 1,
wherein a weight change rate of the polyolefin-based resin is less than or equal to 3 weight % when immersed into a liquid-form crosslinking aid at 50° C. for three hours.

11. The method for manufacturing an encapsulating material sheet for a solar battery according to claim 10,
wherein the liquid-form crosslinking aid is triallyl isocyanurate.

12. The method for manufacturing an encapsulating material sheet for a solar battery according to claim 1,
wherein the polyolefin-based resin is an ethylene/α-olefin copolymer.

13. The method for manufacturing an encapsulating material sheet for a solar battery according to claim 12,
wherein the ethylene/α-olefin copolymer includes ethylene and an a-olefin having 3 to 20 carbon atoms,
a content ratio of a structural unit derived from the ethylene that is included in the ethylene/α-olefin copolymer is in a range of 80 mol % to 90 mol %, and
a content ratio of a structural unit derived from the α-olefin having 3 to 20 carbon atoms that is included in the ethylene/α-olefin copolymer is in a range of 10 mol % to 20 mol %.

* * * * *